US012520686B2

(12) United States Patent
Choi et al.

(10) Patent No.: US 12,520,686 B2
(45) Date of Patent: Jan. 6, 2026

(54) DISPLAY DEVICE AND METHOD FOR FABRICATING THE SAME

(71) Applicant: Samsung Display Co., Ltd., Yongin-Si (KR)

(72) Inventors: Jong Hyun Choi, Yongin-si (KR); Min Jeong Oh, Yongin-si (KR); Youn Joon Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/925,048

(22) Filed: Oct. 24, 2024

(65) Prior Publication Data

US 2025/0248250 A1   Jul. 31, 2025

(30) Foreign Application Priority Data

Jan. 25, 2024   (KR) .......................... 10-2024-0011433

(51) Int. Cl.
*H10K 59/131* (2023.01)
*G09G 3/3233* (2016.01)
(Continued)

(52) U.S. Cl.
CPC ......... *H10K 59/131* (2023.02); *G09G 3/3233* (2013.01); *H10K 59/1201* (2023.02); *H10K 59/1213* (2023.02); *G09G 2300/0426* (2013.01); *G09G 2300/0465* (2013.01); *G09G 2300/0819* (2013.01); *G09G 2300/0842* (2013.01)

(58) Field of Classification Search
CPC ............. H10K 59/131; H10K 59/1201; H10K 59/1213; G09G 3/3233; G09G 2300/0426; G09G 2300/0465; G09G 2300/0819; G09G 2300/0842
See application file for complete search history.

(56) References Cited

U.S. PATENT DOCUMENTS 10,923,545 B2 *  2/2021  Lee .................... H10K 59/1216
11,435,792 B2     9/2022  Hu et al.
(Continued)

FOREIGN PATENT DOCUMENTS

JP       2020-27133 A        2/2020
KR    10-2022-0097678 A       7/2022

*Primary Examiner* — Stacy Khoo
(74) *Attorney, Agent, or Firm* — Innovation Counsel LLP

(57) ABSTRACT

A display device comprises a substrate and a circuit layer. The circuit layer comprises a first semiconductor layer; a first gate insulating layer; a first gate conductive layer; a second gate insulating layer; a second gate conductive layer; a first interlayer insulating layer; a second semiconductor layer; a third gate insulating layer; a third gate conductive layer; a second interlayer insulating layer; and a first source-drain conductive layer. The first source-drain conductive layer comprises at least one connection electrode. Each of the at least one connection electrode is electrically connected to the second semiconductor layer through a first connection hole, and is electrically connected to one of the first semiconductor layer, the first gate conductive layer, and the second gate conductive layer through a second connection hole. The second connection hole overlaps at least a part of the second semiconductor layer and extends through the second semiconductor layer.

20 Claims, 27 Drawing Sheets

(51) Int. Cl.
 *H10K 59/12* (2023.01)
 *H10K 59/121* (2023.01)

(56) References Cited

U.S. PATENT DOCUMENTS

| | | |
|---|---|---|
| 2020/0052129 A1 | 2/2020 | Miyake |
| 2022/0208932 A1 | 6/2022 | Yun |
| 2024/0194139 A1* | 6/2024 | Noh ................. G09G 3/3233 |

* cited by examiner

EPD: EPD1, EPD2
SEL1: E11, E21
GCDL1: GWL, GIL
GCDL2: CAE, VIL, GCL
SEL2: CH3, E13, E23, CH4, E14, E24
GCDL3: G3, G4, GCNE1
SDCDL1: CNE1, CNE2, GCNE2, VDHL

EPD: EPD1, EPD2
SEL1: E11, E21
GCDL1: GWL, GIL
GCDL2: CAE, VIL, GCL
SEL2: CH3, E13, E23, CH4, E14, E24
GCDL3: G3, G4, GCNE1
SDCDL1: CNE1, CNE2, GCNE2, VDHL

EPD: EPD1, EPD2
SEL1: E11, E21
GCDL1: GWL, GIL
GCDL2: CAE, VIL, GCL
SEL2: CH3, E13, E23, CH4, E14, E24
GCDL3: G3, G4, GCNE1

DISPLAY DEVICE AND METHOD FOR FABRICATING THE SAME

CROSS-REFERENCE TO RELATED APPLICATION

This application claims priority from Korean Patent Application No. 10-2024-0011433 filed on Jan. 25, 2024 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a display device and a method for fabricating the same.

2. Description of the Related Art

With the advance of information-oriented society, more and more demands are placed on display devices for displaying images in various ways. For example, display devices are employed in various electronic devices such as smartphones, digital cameras, laptop computers, navigation devices, and smart televisions.

The display device may be a flat panel display device such as a liquid crystal display device, a field emission display device and a light emitting display device. Examples of the light emitting display device may include an organic light emitting display device including organic light emitting elements, an inorganic light emitting display device including inorganic light emitting elements such as inorganic semiconductors, and a micro light emitting display device including micro light emitting elements.

The organic light emitting display device displays an image using light emitting elements, each including a light emitting layer made of an organic light emitting material. As described above, the organic light emitting display device implements image display using a self-light emitting element, and thus may have relatively superior performance in power consumption, response speed, luminous efficiency, luminance, and wide viewing angle compared to other display devices.

One surface of the display device may be a display surface including a display area in which an image is displayed and a non-display area that is a periphery of the display area. Emission areas emitting light with respective luminances and colors may be arranged in the display area.

SUMMARY

The display device may include light emitting elements respectively disposed in emission areas, and light emitting pixel drivers respectively electrically connected to the light emitting elements. The light emitting pixel drivers may supply driving current to the light emitting elements, respectively.

Each of the light emitting pixel drivers may not only include a first transistor that generates a driving current, and a second transistor that is electrically connected between the first transistor and a data line that transmits a data signal, but also further include transistors for selective electrical connection, initialization or reset of some nodes.

As a result, it is difficult to reduce the width of each of the light emitting pixel drivers, which may limit the high resolution of the display device.

In view of the above, aspects of the present disclosure provide a display device capable of reducing a width of each of light emitting pixel drivers while transistors of each of the light emitting pixel drivers are maintained, and thus being advantageous for high resolution.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an aspect of the present disclosure, there is provided a display device comprises a substrate comprising a display area in which emission areas are arranged; and a circuit layer disposed on the substrate. The circuit layer comprises a first semiconductor layer disposed on the substrate; a first gate insulating layer covering the first semiconductor layer; a first gate conductive layer disposed on the first gate insulating layer; a second gate insulating layer covering the first gate conductive layer; a second gate conductive layer disposed on the second gate insulating layer; a first interlayer insulating layer covering the second gate conductive layer; a second semiconductor layer disposed on the first interlayer insulating layer; a third gate insulating layer covering the second semiconductor layer; a third gate conductive layer disposed on the third gate insulating layer; a second interlayer insulating layer covering the third gate conductive layer; and a first source-drain conductive layer disposed on the second interlayer insulating layer. The first source-drain conductive layer comprises at least one connection electrode. Each of the at least one connection electrode is electrically connected to the second semiconductor layer through a first connection hole, and is electrically connected to one of the first semiconductor layer, the first gate conductive layer, and the second gate conductive layer through a second connection hole. The second connection hole overlaps at least a part of the second semiconductor layer and extends through the second semiconductor layer.

The second connection hole is spaced apart from the first connection hole.

The second connection hole overlaps a part of a center of the first connection hole.

The display device further comprises an element layer disposed on the circuit layer, and comprising light emitting elements respectively disposed in the emission areas. The circuit layer comprises light emitting pixel drivers respectively electrically connected to the light emitting elements and arranged in parallel with each other. Each of the light emitting pixel drivers comprises a first transistor electrically connected between a first node and a second node; a first pixel capacitor electrically connected between a first power line and a third node; a second transistor electrically connected between a data line transmitting a data signal and the first node; a third transistor electrically connected between the second node and the third node; and a fourth transistor electrically connected between a first initialization voltage line transmitting a first initialization voltage and the third node. The first node is electrically connected to a first electrode of the first transistor. The second node is electrically connected to a second electrode of the first transistor. The third node is electrically connected to a gate electrode of the first transistor.

Each of the first transistor and the second transistor comprises a channel portion, a first electrode portion, and a second electrode portion disposed in the first semiconductor layer, and a gate electrode disposed in the first gate conductive layer and overlapping the channel portion. Each of the third transistor and the fourth transistor comprises a channel portion, a first electrode portion, and a second electrode portion disposed in the second semiconductor layer, and a gate electrode disposed in the third gate conductive layer and overlapping the channel portion of each of the third transistor and the fourth transistor. The first electrode portion is connected to one side of the channel portion of each of the first transistor and the second transistor, and the second electrode portion is connected to an other side of the channel portion of each of the first transistor and the second transistor.

The at least one connection electrode comprises a first connection electrode electrically connecting the first electrode portion of the third transistor to the second electrode portion of the first transistor; and a second connection electrode electrically connecting the first electrode portion of the fourth transistor to the first initialization voltage line.

The second connection hole of the first connection electrode extends through the second interlayer insulating layer, the third gate insulating layer, the second semiconductor layer, the first interlayer insulating layer, the second gate insulating layer, and the first gate insulating layer, and reaches the second electrode portion of the first transistor. The first connection hole of the first connection electrode extends through the second interlayer insulating layer and the third gate insulating layer and is spaced apart from the second connection hole of the first connection electrode.

The second connection hole of the first connection electrode extends through the second interlayer insulating layer, the third gate insulating layer, the second semiconductor layer, the first interlayer insulating layer, the second gate insulating layer, and the first gate insulating layer, and reaches the second electrode portion of the first transistor. The first connection hole of the first connection electrode extends through the second interlayer insulating layer and the third gate insulating layer and overlaps a part of the second connection hole of the first connection electrode.

The first initialization voltage line is disposed on the second gate conductive layer. The second connection hole of the second connection electrode extends through the second interlayer insulating layer, the third gate insulating layer, the second semiconductor layer, and the first interlayer insulating layer and reaches the first initialization voltage line. The first connection hole of the second connection electrode extends through the second interlayer insulating layer and the third gate insulating layer and is spaced apart from the second connection hole of the second connection electrode.

The first initialization voltage line is disposed on the second gate conductive layer. The second connection hole of the second connection electrode extends through the second interlayer insulating layer, the third gate insulating layer, the second semiconductor layer, and the first interlayer insulating layer and reaches the first initialization voltage line. The first connection hole of the second connection electrode extends through the second interlayer insulating layer and the third gate insulating layer and overlaps a part of the second connection hole of the second connection electrode.

Each of the light emitting pixel drivers further comprises a fifth transistor electrically connected between the first power line and the first node; a sixth transistor electrically connected between the second node and a fourth node; and a seventh transistor electrically connected between a second initialization voltage line transmitting a second initialization voltage and the fourth node. Each of the fifth transistor, the sixth transistor, and the seventh transistor comprises a channel portion, a first electrode portion, and a second electrode portion disposed in the first semiconductor layer, and a gate electrode disposed in the first gate conductive layer and overlapping the channel portion. The first electrode portion is connected to one side of the channel portion. The second electrode portion is connected to an other side of the channel portion.

The circuit layer further comprises a first planarization layer covering the first source-drain conductive layer; a second source-drain conductive layer disposed on the first planarization layer; and a second planarization layer covering the second source-drain conductive layer.

According to an aspect of the present disclosure, there is provided a method for fabricating a display device, the method comprises preparing a substrate comprising a display area in which emission areas are arranged; and disposing a circuit layer comprising light emitting pixel drivers arranged side by side in a first direction and a second direction, on the substrate. The disposing of the circuit layer comprises disposing a first semiconductor layer on the substrate; disposing a first gate insulating layer covering the first semiconductor layer; disposing a first gate conductive layer on the first gate insulating layer; disposing a second gate insulating layer covering the first gate conductive layer; disposing a second gate conductive layer on the second gate insulating layer; disposing a first interlayer insulating layer covering the second gate conductive layer; disposing a second semiconductor layer on the first interlayer insulating layer; disposing a third gate insulating layer covering the second semiconductor layer; disposing a third gate conductive layer on the third gate insulating layer; disposing a second interlayer insulating layer covering the third gate conductive layer; disposing a first connection hole reaching the second semiconductor layer; disposing a second connection hole reaching one of the first semiconductor layer, the first gate conductive layer, and the second gate conductive layer; and disposing a first source-drain conductive layer on the second interlayer insulating layer. In the disposing of the second connection hole, the second connection hole overlaps at least a part of the second semiconductor layer and extends through the second semiconductor layer.

In the disposing of the second connection hole, the second connection hole is spaced apart from the first connection hole.

In the disposing of the second connection hole, the second connection hole overlaps a part of a center of the first connection hole.

In the disposing of the first source-drain conductive layer, the first source-drain conductive layer comprises at least one connection electrode. Each of the at least one connection electrode is electrically connected to the second semiconductor layer through the first connection hole, and is electrically connected to one of the first semiconductor layer, the first gate conductive layer, and the second gate conductive layer through the second connection hole.

The method further comprises, after disposing the circuit layer, disposing an element layer comprising light emitting elements respectively disposed in the emission areas. The light emitting pixel drivers respectively are electrically connected to the light emitting elements. Each of the light emitting pixel drivers comprises a first transistor electrically connected between a first node and a second node; a first pixel capacitor electrically connected between a first power line and a third node; a second transistor electrically connected between a data line transmitting a data signal and the first node; a third transistor electrically connected between the second node and the third node; and a fourth transistor electrically connected between a first initialization voltage line transmitting a first initialization voltage and the third node. The first node is electrically connected to a first electrode of the first transistor. The second node is electrically connected to a second electrode of the first transistor. The third node is electrically connected to a gate electrode of the first transistor. Each of the first transistor and the second transistor comprises a channel portion, a first electrode portion, and a second electrode portion disposed in the first semiconductor layer, and a gate electrode disposed in the first gate conductive layer and overlapping the channel portion. Each of the third transistor and the fourth transistor comprises a channel portion, a first electrode portion, and a second electrode portion disposed in the second semiconductor layer, and a gate electrode disposed in the third gate conductive layer and overlapping the channel portion of each of the third transistor and the fourth transistor. The first electrode portion is connected to one side of the channel portion of each of the first transistor and the second transistor. The second electrode portion is connected to an other side of the channel portion of each of the first transistor and the second transistor.

The at least one connection electrode comprises a first connection electrode electrically connecting the first electrode portion of the third transistor to the second electrode portion of the first transistor; and a second connection electrode electrically connecting the first electrode portion of the fourth transistor to the first initialization voltage line.

The second connection hole of the first connection electrode extends through the second interlayer insulating layer, the third gate insulating layer, the second semiconductor layer, the first interlayer insulating layer, the second gate insulating layer, and the first gate insulating layer, and reaches the second electrode portion of the first transistor. The first connection hole of the first connection electrode extends through the second interlayer insulating layer and the third gate insulating layer and overlaps a part of the second connection hole of the first connection electrode.

In the disposing of the second gate conductive layer, the second gate conductive layer comprises the first initialization voltage line. The second connection hole of the second connection electrode extends through the second interlayer insulating layer, the third gate insulating layer, the second semiconductor layer, and the first interlayer insulating layer and reaches the first initialization voltage line. The first connection hole of the second connection electrode extends through the second interlayer insulating layer and the third gate insulating layer and overlaps a part of the second connection hole of the second connection electrode.

The display device according to embodiments may include a substrate and a circuit layer. The circuit layer may include a first semiconductor layer disposed on the substrate, a first gate insulating layer covering the first semiconductor layer, a first gate conductive layer disposed on the first gate insulating layer, a second gate insulating layer covering the first gate conductive layer, a second gate conductive layer disposed on the second gate insulating layer, a first interlayer insulating layer covering the second gate conductive layer, a second semiconductor layer disposed on the first interlayer insulating layer, a third gate insulating layer covering the second semiconductor layer, a third gate conductive layer disposed on the third gate insulating layer, a second interlayer insulating layer covering the third gate conductive layer, and a first source-drain conductive layer disposed on the second interlayer insulating layer. The first source-drain conductive layer may include at least one connection electrode. Each of the at least one connection electrode may be electrically connected to the second semiconductor layer through a first connection hole, and may be electrically connected to one of the first semiconductor layer, the first gate conductive layer, and the second gate conductive layer through a second connection hole. Here, the second connection hole may overlap at least a part of the second semiconductor layer and extend through the second semiconductor layer.

That is, according to embodiments, a second connection hole electrically connecting one of a first semiconductor layer, a first gate conductive layer, and a second gate conductive layer to at least one connection electrode may not be spaced apart from a second semiconductor layer, but rather, may overlap a part of the second semiconductor layer and overlap at least a part of the second semiconductor layer.

In this way, the separation distance between a first connection hole and the second connection hole may be reduced, so that the width allocated to at least one connection electrode in each of the light emitting pixel drivers may be reduced.

Accordingly, the width of each of the light emitting pixel drivers may be reduced, which may be advantageous for the high resolution of the display device.

However, effects according to the embodiments of the present disclosure are not limited to those exemplified above and various other effects are incorporated herein.

BRIEF DESCRIPTION OF THE DRAWINGS

The above and other aspects and features of the present disclosure will become more apparent by describing in detail embodiments thereof with reference to the attached drawings.

DETAILED DESCRIPTION OF THE EMBODIMENTS

Figure 1:
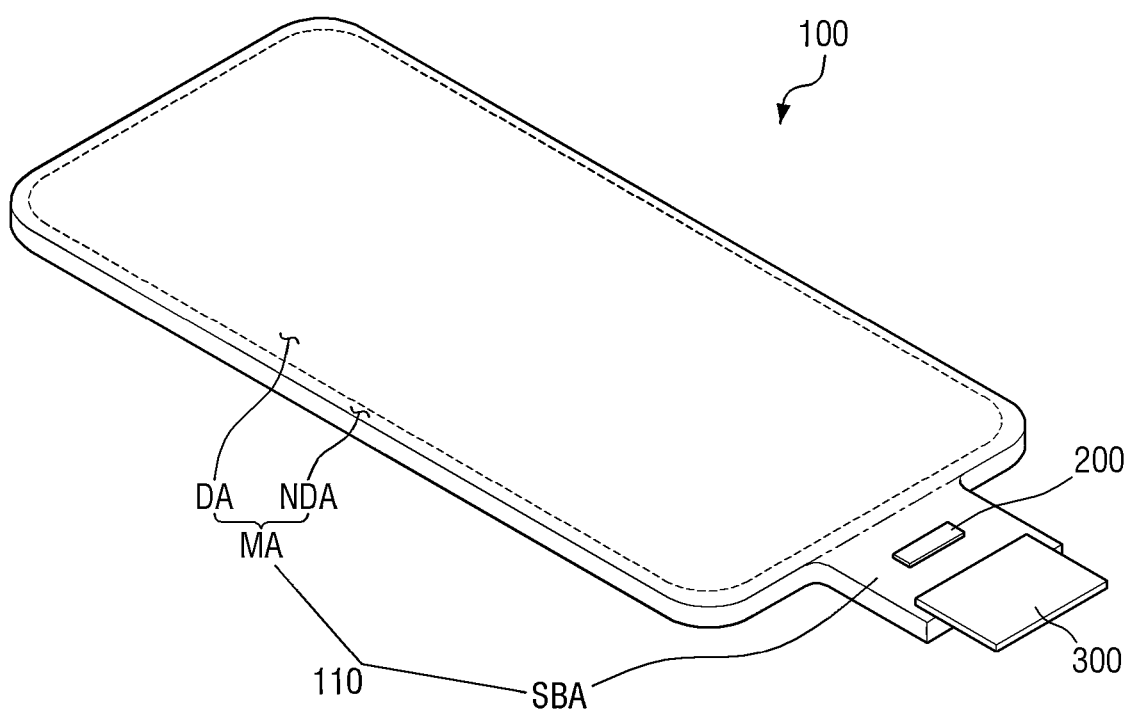
FIG. 1 is a perspective view illustrating a display device according to embodiments.
Figure 1:
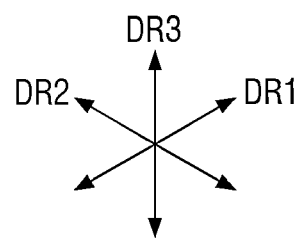

The embodiments will now be described more fully hereinafter with reference to the accompanying drawings.

The embodiments may, however, be provided in different forms and should not be construed as limiting. The same reference numbers indicate the same components throughout the disclosure. In the accompanying figures, the thickness of layers and regions may be exaggerated for clarity.

Some of the parts which are not associated with the description may not be provided in order to describe embodiments of the disclosure.

It will also be understood that when a layer is referred to as being "on" another layer or substrate, it can be directly on the other layer or substrate, or intervening layers may also be present. In contrast, when an element is referred to as being "directly on" another element, there may be no intervening elements present.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

The spatially relative terms "below," "beneath," "lower," "above," "upper," or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

When an element is referred to as being "connected" or "coupled" to another element, the element may be "directly connected" or "directly coupled" to another element, or "electrically connected" or "electrically coupled" to another element with one or more intervening elements interposed therebetween. It will be further understood that when the terms "comprises," "comprising," "has," "have," "having," "includes" and/or "including" are used, they may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

The terms "about" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within ±30%, 20%, 10%, 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Hereinafter, embodiments will be described with reference to the accompanying drawings.

Figure 2:
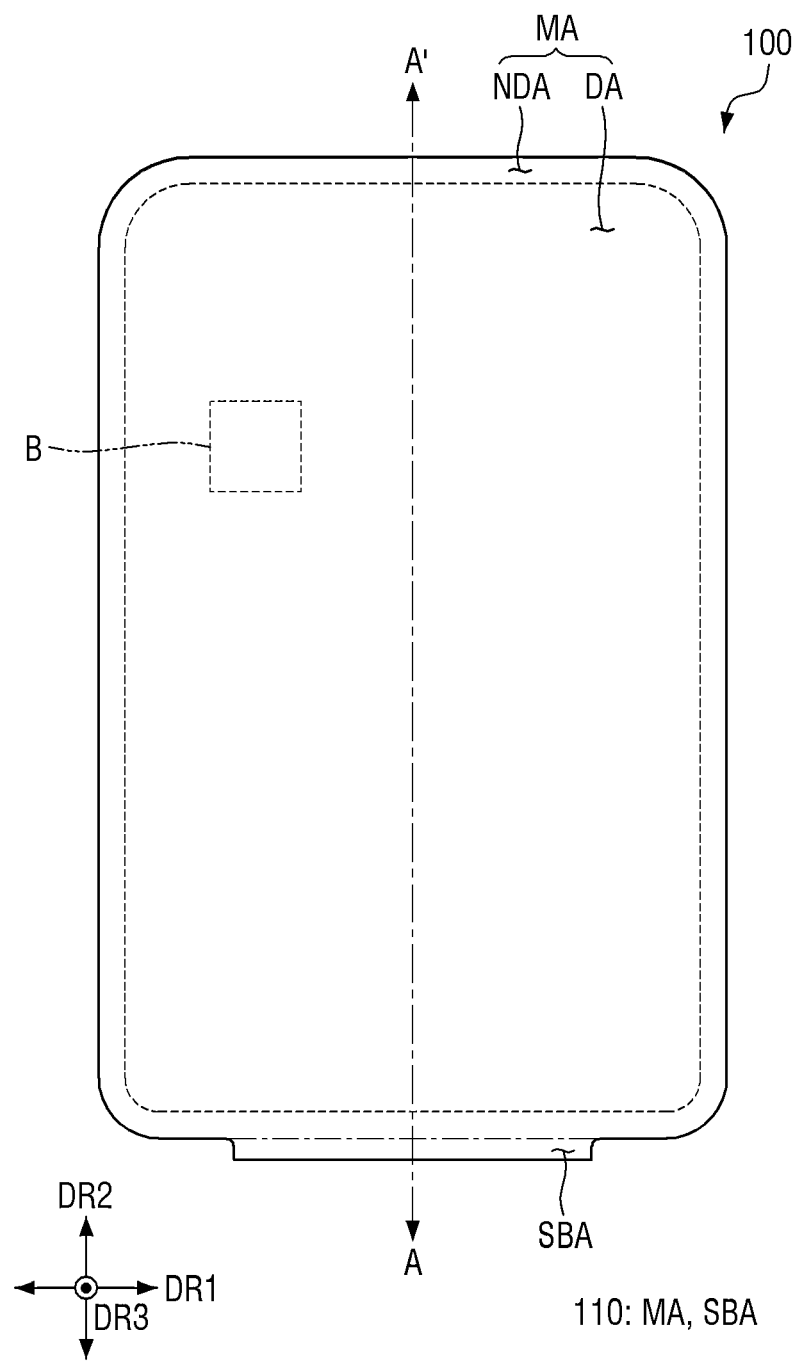
FIG. 2 is a plan view illustrating the display device of FIG. 1.
Figure 3:
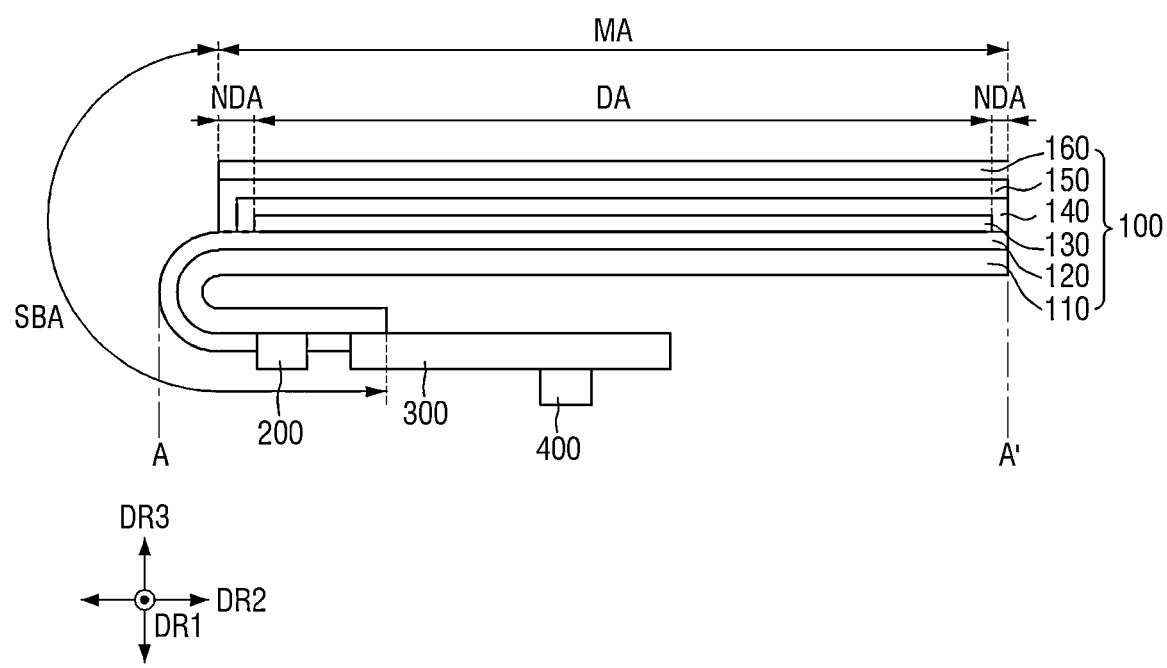
FIG. 3 is a cross-sectional view taken along line A-A' of FIG. 2.

FIG. 1 is a perspective view illustrating a display device 100 according to embodiments. FIG. 2 is a plan view illustrating the display device 100 of FIG. 1. FIG. 3 is a cross-sectional view taken along line A-A' of FIG. 2.

Referring to FIGS. 1 and 2, the display device 100 is a device for displaying a moving image or a still image. The display device 100 may be used as a display screen of various devices, such as a television, a laptop computer, a monitor, a billboard and an Internet-of-Things (IOT) device, as well as portable electronic devices such as a mobile phone, a smartphone, a tablet personal computer (PC), a smart watch, a watch phone, a mobile communication terminal, an electronic notebook, an electronic book, a portable multimedia player (PMP), a navigation device and an ultra-mobile PC (UMPC).

The display device 100 may be a light emitting display device such as an organic light emitting display using an organic light emitting diode, a quantum dot light emitting display including a quantum dot light emitting layer, an inorganic light emitting display including an inorganic semiconductor, and a micro light emitting display using a micro or nano light emitting diode (LED). In the following description, it is assumed that the display device 100 is an organic light emitting display device. However, the present disclosure is not limited thereto, and may be applied to a display device including an organic insulating material, an organic light emitting material, and a metal material.

The display device 100 may be formed to be flat, but is not limited thereto. For example, the display device 100 may include a curved portion formed at left and right ends and having a constant curvature or a varying curvature. In addition, the display device 100 may be formed to be flexible so that it can be curved, bent, folded, or rolled.

As illustrated in FIGS. 1, 2 and 3, the display device 100 includes a substrate 110. The substrate 110 may include a main region MA corresponding to a display surface of the display device 100 and a sub-region SBA protruding from one side of the main region MA.

As shown in FIG. 2, the main region MA may include a display area DA disposed at most of the center thereof, and a non-display area NDA disposed around the display area DA.

The display area DA may, in plan view, be formed in a rectangular shape having short sides in a first direction DR1 and long sides in a second direction DR2 crossing the first direction DR1. The corner where the short side in the first direction DR1 and the long side in the second direction DR2 meet may be rounded to have a predetermined curvature or may be right-angled. The planar shape of the display area DA is not limited to the rectangular shape, and may be formed in another polygonal shape, a circular shape or an elliptical shape. The plan view of the display area may be taken from a third direction DR3 crossing the first and second directions DR1, DR2.

The non-display area NDA may be disposed at the edge of the main region MA to surround the display area DA.

The sub-region SBA may be a region protruding from the non-display area NDA of the main region MA to one side in the second direction DR2.

Since a part of the sub-region SBA is transformed into a bent shape, another part of the sub-region SBA may be disposed on the rear surface of the display device 100.

FIGS. 2 and 3 illustrate the display device 100 with a part of the sub-region SBA in a bent state.

Referring to FIG. 3, the display device 100 according to embodiments includes the substrate 110, a circuit layer 120 disposed on the substrate 110, and an element layer 130 disposed on the circuit layer 120.

The display device 100 according to embodiments may further include an encapsulation layer 140 disposed on the element layer 130, and a touch sensor layer 150 disposed on the encapsulation layer 140.

Also, the display device 100 according to embodiments may further include a polarization layer 160 disposed on the touch sensor layer 150 to reduce reflection of external light.

The substrate 110 may be formed of an insulating material such as a polymer resin. For example, the substrate 110 may be formed of polyimide. The substrate 110 may be a flexible substrate which can be bent, folded or rolled.

In an embodiment, the substrate 110 may be formed of an insulating material such as glass or the like.

The substrate 110 may include the main region MA and the sub-region SBA. The main region MA may include the display area DA and the non-display area NDA.

A display driving circuit 200 may be mounted on the sub-region SBA of the substrate 110, and a display circuit board 300 may be attached thereto.

The display driving circuit 200 may be electrically connected to the data lines DL (see FIG. 6) of the circuit layer 120. The display driving circuit 200 may output a data signal based on control signals and power voltages supplied from the display circuit board 300.

The display driving circuit 200 may be provided as an integrated circuit (IC) and mounted on the sub-region SBA of the display device 100 by a chip on glass (COG) method, a chip on plastic (COP) method, or an ultrasonic method. However, this is only an example, and one embodiment is not limited thereto. For example, the display driving circuit 200 may be mounted on the display circuit board 300.

One end of the display circuit board 300 may be attached onto pads disposed on one edge of the sub-region SBA of the display device 100 by using an anisotropic conductive film.

The display circuit board 300 may be a flexible printed circuit board (FPCB) which is bendable, a rigid printed circuit board (PCB) which maintains a flat shape, or a composite printed circuit board having both of the rigid printed circuit board and the flexible printed circuit board.

A touch driving circuit 400 may be mounted on the display circuit board 300.

The touch driving circuit 400 may be electrically connected to the touch sensor layer 150 of the display device 100.

The touch driving circuit 400 may determine whether the user has touched the display area DA or otherwise conveyed an input by applying touch driving signals to driving lines of the touch sensor layer 150 and detecting changes in capacitances based on touch sensing signals received from sensing lines. In one embodiment, a user's "touch" means that an object such as a pen or a user's finger is in direct contact with the top surface of the cover window disposed on the touch sensor layer. Besides a "touch," a user may convey an input through an "approach," which is intended to mean an object such as the pen or the user's finger hovering over the top surface of the cover window without direct contact. For simplicity, a "touch" will be used to refer to user input in this disclosure with the understanding that the inventive concept is adaptable to other types of user input. The touch driving circuit 400 may output touch data including the user's touch coordinates to a main processor.

Figure 4:
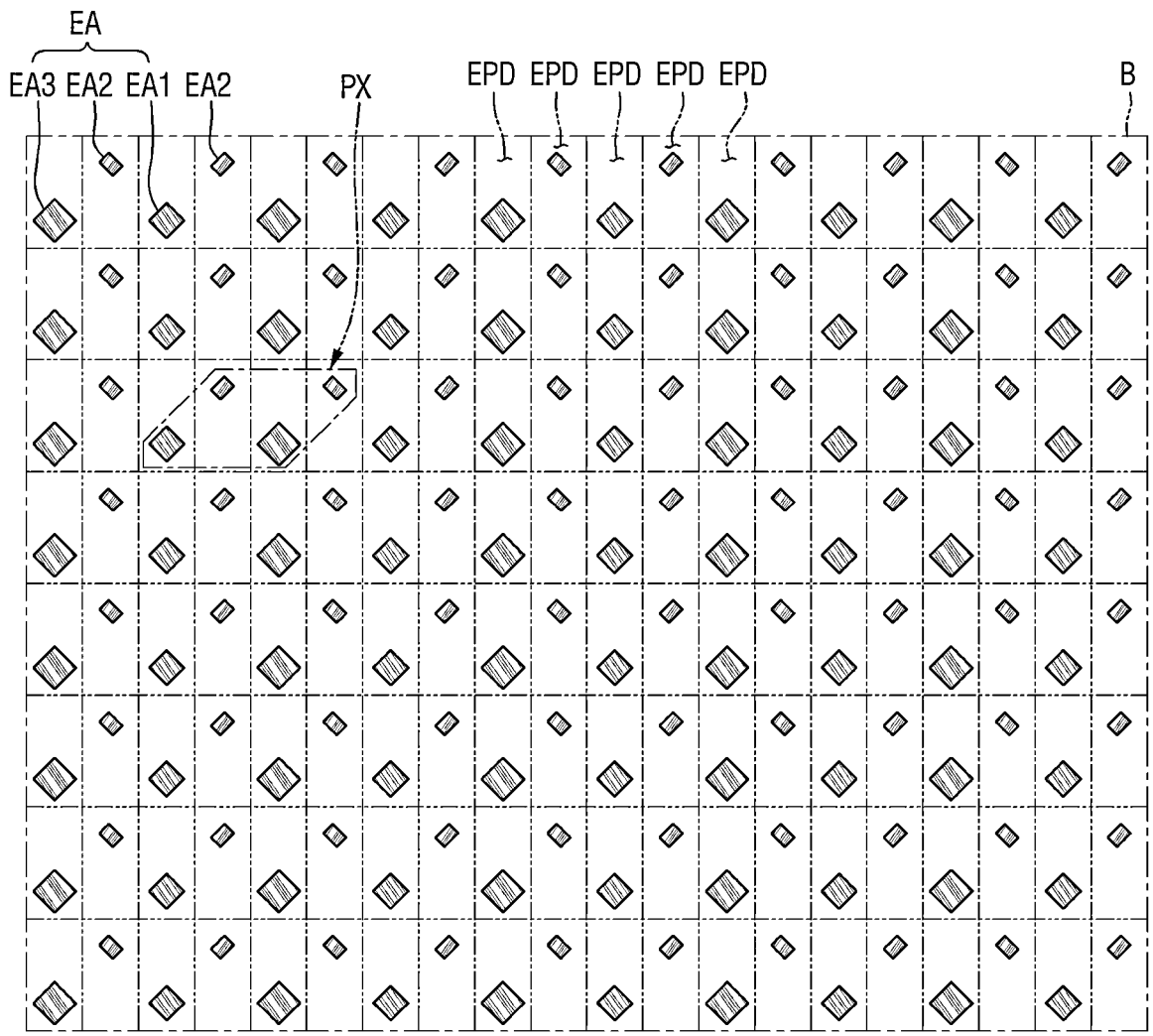
FIG. 4 is a layout diagram illustrating part B of FIG. 2.
Figure 4:
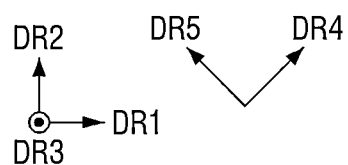

FIG. 4 is a layout diagram illustrating part B of FIG. 2.

Referring to FIG. 4, the display area DA of the display device 100 according to embodiments may include the emission areas EA. In addition, the display area DA may further include a non-emission area disposed in a gap between the emission areas EA.

The light emitting pixel drivers EPD respectively corresponding to the emission areas EA may be arranged in the display area DA in parallel with each other in the first direction DR1 and the second direction DR2. The light emitting pixel drivers EPD may be respectively electrically connected to light emitting elements LE (see FIGS. 5 and 6) of the element layer 130 respectively disposed in the emission areas EA.

The emission areas EA may have a rhombus shape or a rectangular shape in plan view. However, this is only an example, and the planar shape of the emission areas EA according to an embodiment is not limited to that illustrated in FIG. 4. That is, in plan view, the emission areas EA may have a polygonal shape such as a square, a pentagon, a hexagon, etc., or may have a circular or elliptical shape including the edge of a curve.

The emission areas EA may include first emission areas EA1 emitting light of a first color in a predetermined wavelength band, second emission areas EA2 emitting light of a second color in a wavelength band lower than that of the first color, and third emission areas EA3 emitting light of a third color in a wavelength band lower than that of the second color.

For example, the first color may be red having a wavelength band of approximately 600 nm to 750 nm. The second color may be green having a wavelength band of approximately 480 nm to 560 nm. The third color may be blue having a wavelength band of approximately 370 nm to 460 nm.

The first emission areas EA1 and the third emission areas EA3 may be alternately arranged in at least one of the first direction DR1 or the second direction DR2.

The second emission areas EA2 may be arranged side by side with each other in at least one of the first direction DR1 or the second direction DR2.

In addition, the second emission areas EA2 may be adjacent to the first emission areas EA1 and the third emission areas EA3 in diagonal directions DR4 and DR5 intersecting the first direction DR1 and the second direction DR2.

Pixels PX displaying their own luminances and colors may be provided by the first emission area EA1, the second emission area EA2, and the third emission area EA3 adjacent to each other among these emission areas EA.

In other words, the pixels PX may be a basic unit for displaying various colors including white with a predetermined luminance.

Each of the pixels PX may include at least one first emission area EA1, at least one second emission area EA2, and at least one third emission area EA3 that are adjacent to each other. Accordingly, each of the pixels PX may display various colors through a mixture of the light emitted from the first emission area EA1, the second emission area EA2, and the third emission area EA3 that are adjacent to each other.

Figure 5:
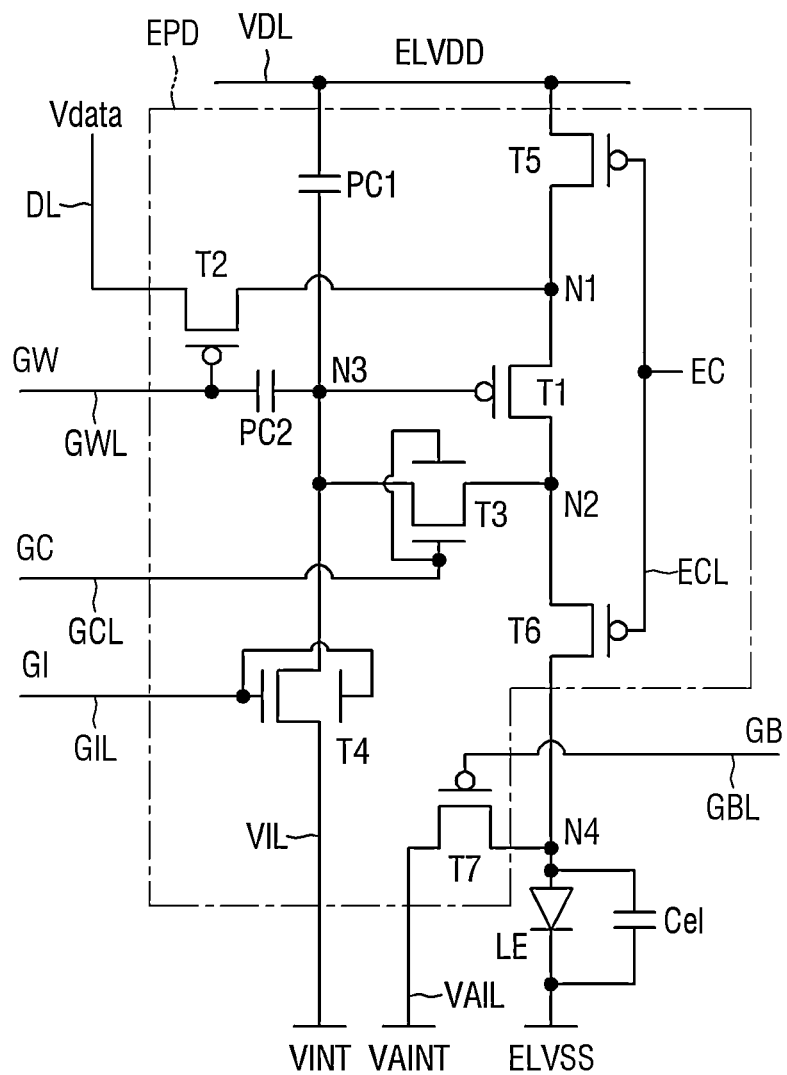
FIG. 5 is an equivalent circuit diagram showing the light emitting pixel driver of FIG. 4 according to embodiments.

FIG. 5 is an equivalent circuit diagram showing the light emitting pixel driver EPD of FIG. 4 according to embodiments.

Referring to FIG. 5, one of the light emitting elements LE of the element layer 130 may be electrically connected between one of the light emitting pixel drivers EPD of the circuit layer 120 and a second power ELVSS.

That is, the anode electrode of the light emitting element LE is electrically connected to the light emitting pixel driver EPD, and the cathode electrode of the light emitting element LE may be applied with the second power ELVSS lower than a first power ELVDD.

A capacitor Cel connected in parallel with the light emitting element LE refers to a parasitic capacitance between the anode electrode and the cathode electrode.

The circuit layer 120 may further include a first power line VDL for transmitting the first power ELVDD, a first initialization voltage line VIL for transmitting a first initialization voltage VINT, and a second initialization voltage line VAIL for transmitting a second initialization voltage VAINT.

The circuit layer 120 may further include a scan write line GWL for transmitting a scan write signal GW, a scan initialization line GIL for transmitting a scan initialization signal GI, an emission control line ECL for transmitting an emission control signal EC, a gate control line GCL for transmitting a gate control signal GC, and a bias control line GBL for transmitting a bias control signal GB.

One light emitting pixel driver EPD of the circuit layer 120 may include a first transistor T1 configured to generate a driving current for driving the light emitting element LE, two or more transistors T2 to T7 electrically connected to the first transistor T1, and at least one capacitor PC1.

The first transistor T1 may be electrically connected between a first node N1 and a second node N2. The first node N1 is electrically connected to the first electrode (e.g., source electrode) of the first transistor T1. The second node N2 is electrically connected to the second electrode (e.g., drain electrode) of the first transistor T1.

The first capacitor PC1 may be electrically connected between the first power line VDL and a third node N3. The third node N3 is electrically connected to the gate electrode of the first transistor T1.

That is, the gate electrode of the first transistor T1 may be electrically connected to the first power line VDL through the first pixel capacitor PC1.

Accordingly, the potential of the gate electrode of the first transistor T1 may be maintained at the voltage charged in the first power line VDL.

The second transistor T2 may be electrically connected between a data line DL and the first node N1.

In other words, the second transistor T2 may be electrically connected between the first electrode of the first transistor T1 and the data line DL.

The second transistor T2 may be turned on by the scan write signal GW of the scan write line GWL.

That is, the first electrode of the first transistor T1 may be electrically connected to the data line DL through the second transistor T2.

The third transistor T3 may be electrically connected between the second node N2 and the third node N3. That is, the third transistor T3 may be electrically connected between the gate electrode of the first transistor T1 and the second electrode of the first transistor T1. The third transistor T3 may be turned on by the gate control signal GC of the gate control line GCL.

Through the turned-on third transistor T3, the voltage difference between the second node N2 and the third node N3 may be initialized.

The fourth transistor T4 may be electrically connected between the first initialization voltage line VIL and the third node N3. That is, the fourth transistor T4 may be connected between the gate electrode of the first transistor T1 and the first initialization voltage line VIL. The fourth transistor T4 may be turned on by the scan initialization signal GI of the scan initialization line GIL.

The potential of the third node N3 may be initialized through the turned-on fourth transistor T4.

The fifth transistor T5 may be electrically connected between the first node N1 and the first power line VDL.

The sixth transistor T6 may be electrically connected between the second node N2 and a fourth node N4. The fourth node N4 is electrically connected to the anode electrode of the light emitting element LE.

That is, the fifth transistor T5 may be electrically connected between the first electrode of the first transistor T1 and the first power line VDL.

The sixth transistor T6 may be electrically connected between the second electrode of the first transistor T1 and the anode electrode of the light emitting element LE.

In other words, the first electrode (e.g., the source electrode) of the first transistor T1 may be electrically connected to the first power line VDL through the fifth transistor T5. Further, the second electrode (e.g., the drain electrode) of the first transistor T1 may be electrically connected to the anode electrode of the light emitting element LE through the sixth transistor T6.

The fifth transistor T5 and the sixth transistor T6 may be turned on by the emission control signal EC of the emission control line ECL.

When a data signal Vdata of the data line DL is transmitted to the first electrode of the first transistor T1 through the turned-on second transistor T2, the voltage difference between the gate electrode of the first transistor T1 and the first electrode of the first transistor T1 may be a difference voltage between the first power ELVDD and the data signal Vdata.

In this case, when the voltage difference between the gate electrode of the first transistor T1 and the first electrode of the first transistor T1, i.e., the gate-source voltage difference becomes equal to or greater than a threshold voltage, the first transistor T1 may be turned on, thereby generating a drain-source current of the first transistor T1 corresponding to the data signal Vdata.

When the fifth transistor T5 and the sixth transistor T6 are turned on, the first transistor T1 may be connected in series with the light emitting element LE between the first power line VDL and a second power line VSL. Accordingly, the drain-source current of the first transistor T1 corresponding to the data signal Vdata may be supplied as a driving current of the light emitting element LE.

Accordingly, the light emitting element LE may emit light having a luminance corresponding to the data signal Vdata.

The seventh transistor T7 may be electrically connected between the fourth node N4 and the second initialization voltage line VAIL. That is, the seventh transistor T7 may be electrically connected between the anode electrode of the light emitting element LE and the second initialization voltage line VAIL. The seventh transistor T7 may be turned on by the bias control signal GB of the bias control line GBL.

The potential of the fourth node N4 may be initialized through the turned-on seventh transistor T7.

In accordance with embodiments, among the first to seventh transistors T1 to T7, the third transistor T3 and the fourth transistor T4 may be N-type MOSFETs, and the other transistors T1, T2, and T5 to T7 except the third transistor T3 and the fourth transistor T4 may be P-type MOSFETs.

That is, while each of the third transistor T3 and the fourth transistor T4 among the first to seventh transistors T1 to T7 included in the light emitting pixel driver EPD is implemented as an N-type MOSFET, each of the remaining transistors T1, T2, and T5 to T7 except for these two may be implemented as a P-type MOSFET.

Figure 7:
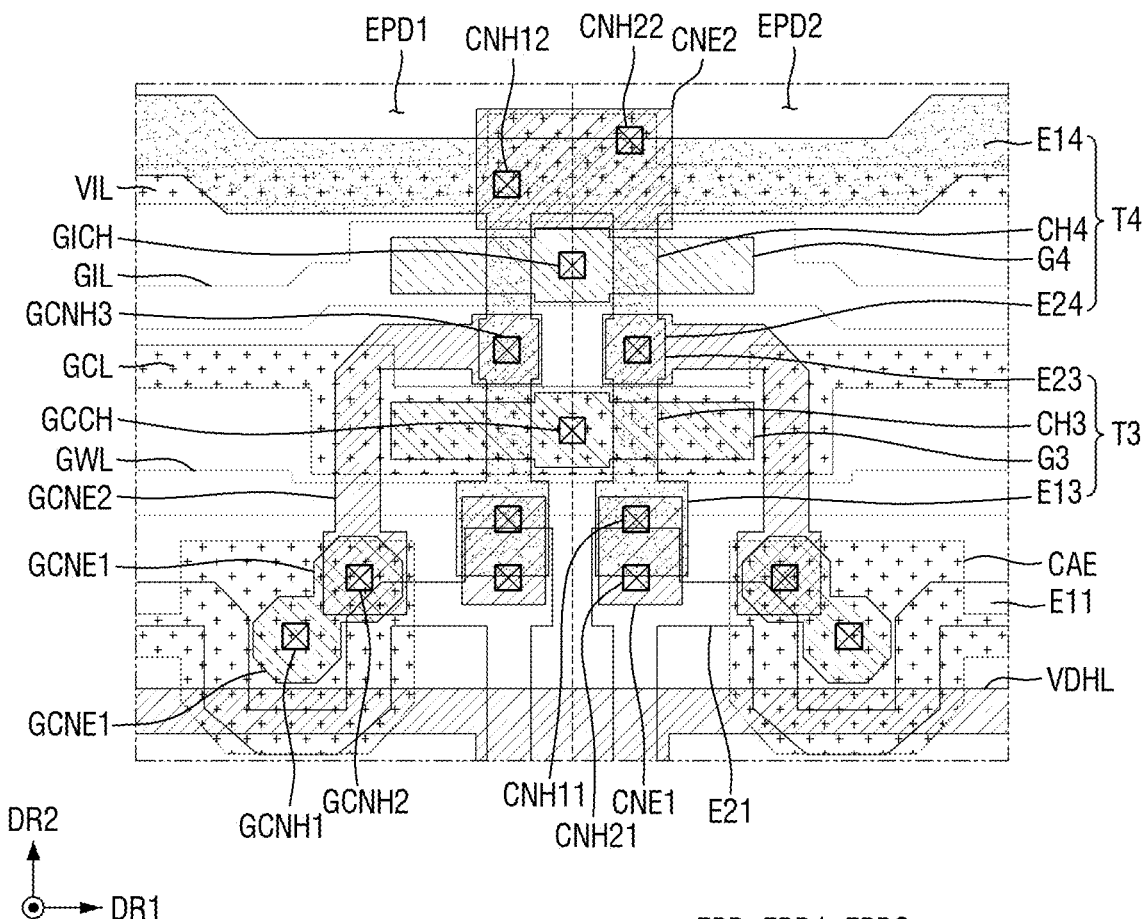
FIGS. 7, 8, and 9 are plan views illustrating a third transistor and a fourth transistor of adjacent light emitting pixel drivers according to embodiments.

Accordingly, according to embodiments, the circuit layer 120 may include a first semiconductor layer SEL1 (see FIG. 7) and a second semiconductor layer SEL2 (see FIG. 7).

The first semiconductor layer SEL1 (see FIG. 7) may include a channel portion, a first electrode portion, and a second electrode portion of N-type MOSFETs among the first to seventh transistors T1 to T7 of each of the light emitting pixel drivers EPD, that is, each of the first transistor T1, the second transistor T2, the fifth transistor T5, the sixth transistor T6, and the seventh transistor T7. In each of the first transistor T1, the second transistor T2, the fifth transistor T5, the sixth transistor T6, and the seventh transistor T7, the channel portion may overlap the gate electrode. Further, in each of the first transistor T1, the second transistor T2, the fifth transistor T5, the sixth transistor T6, and the seventh transistor T7, the first electrode portion and the second electrode portion may be connected to both ends of the channel portion. The first electrode portion may become the first electrode, and the second electrode portion may become the second electrode.

The second semiconductor layer SEL2 (see FIG. 7) may include a channel portion, a first electrode portion, and a second electrode portion of P-type MOSFETs among the first to seventh transistors T1 to T7 of each of the light emitting pixel drivers EPD, that is, each of the third transistor T3 and the fourth transistor T4. In each of the third transistor T3 and the fourth transistor T4, the channel portion may be disposed between the first gate electrode and the second gate electrode that overlap each other, and may overlap the first gate electrode and the second gate electrode. In each of the third transistor T3 and the fourth transistor T4, the first electrode portion and the second electrode portion may be connected to both ends of the channel portion. The first electrode portion may become the first electrode, and the second electrode portion may become the second electrode.

Figure 6:
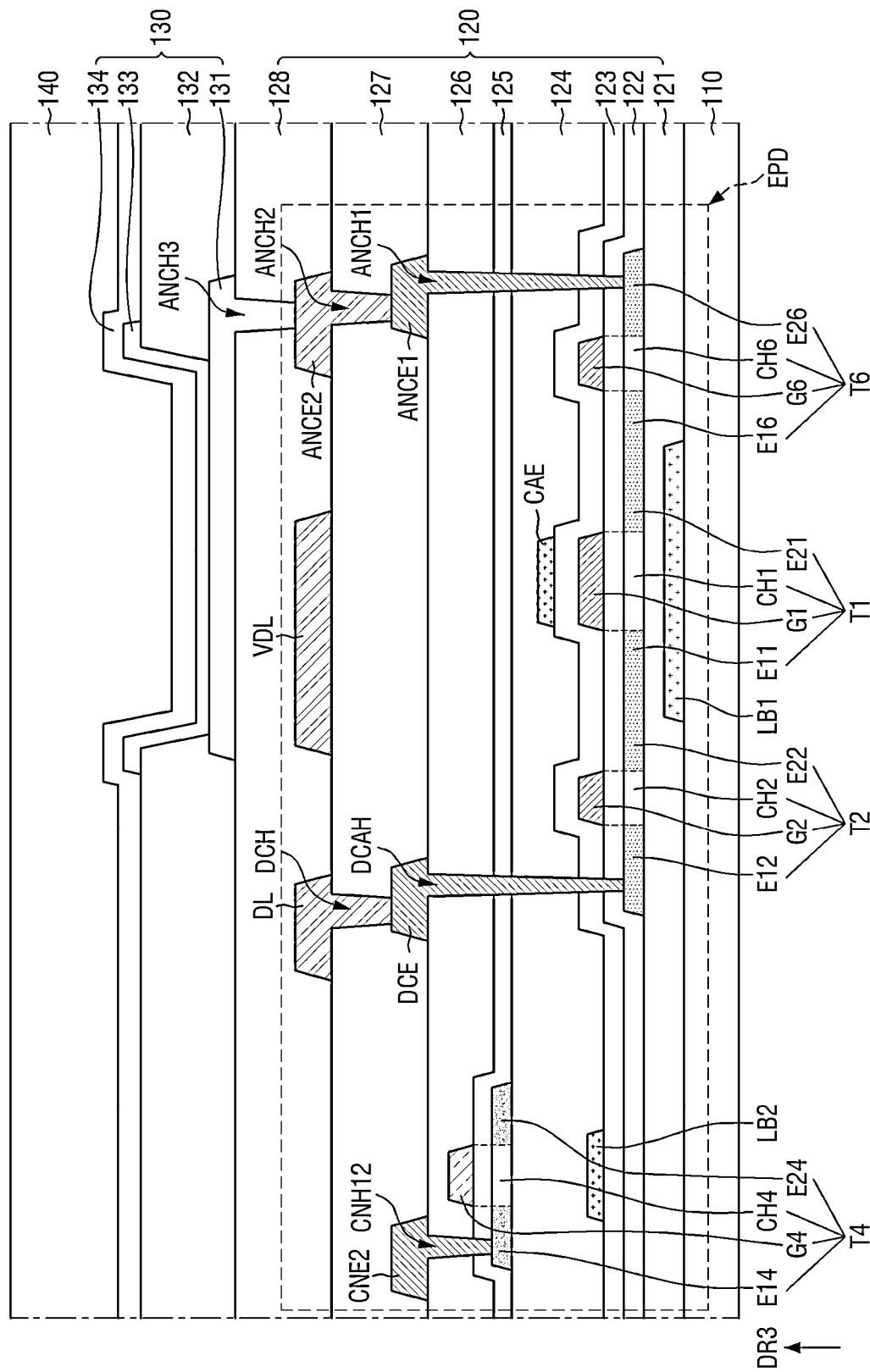
FIG. 6 is a cross-sectional view illustrating a first transistor, a sixth transistor, and a light emitting element shown in FIG. 5.

FIG. 6 is a cross-sectional view illustrating the first transistor T1, the sixth transistor T6, and the light emitting element LE shown in FIG. 5.

Referring to FIG. 6, the display device 100 according to embodiments may include the substrate 110, the circuit layer 120 on the substrate 110, the element layer 130 on the circuit layer 120, and the encapsulation layer 140 on the element layer 130.

According to embodiments, the circuit layer 120 may include a first semiconductor layer CH1, E11, E21, CH2, E12, E22, CH6, E16, and E26 disposed on the substrate 110, a first gate insulating layer 122 covering the first semiconductor layer, a first gate conductive layer G1, G2, and G6 disposed on the first gate insulating layer 122, a second gate insulating layer 123 covering the first gate conductive layer, a second gate conductive layer CAE and LB2 disposed on the second gate insulating layer 123, a first interlayer insulating layer 124 covering the second gate conductive layer, a second semiconductor layer CH4, E14, and E24 disposed on the first interlayer insulating layer 124, a third gate insulating layer 125 covering the second semiconductor layer, a third gate conductive layer G4 disposed on the third gate insulating layer 125, a second interlayer insulating layer 126 covering the third gate conductive layer, and a first source-drain conductive layer ANCE1, VIL (see FIG. 7), and DCE disposed on the second interlayer insulating layer 126.

According to embodiments, the circuit layer 120 may further include a first planarization layer 127 covering the first source-drain conductive layer, a second source-drain conductive layer DL and ANCE2 disposed on the first planarization layer 127, and a second planarization layer 128 covering the second source-drain conductive layer.

According to embodiments, the circuit layer 120 may further include a buffer layer 121 covering the substrate 110. In this case, the first semiconductor layer may be disposed on the buffer layer 121. The buffer layer 121 may cover a first light blocking portion LB1 on the substrate 110.

The first light blocking portion LB1 may overlap the channel portion CH1 of the first transistor T1.

As previously described with reference to FIG. 5, the circuit layer 120 may include the light emitting pixel drivers EPD electrically connected to the light emitting elements LE disposed in the emission areas EA, respectively, and wires that transmit various signals and voltages to the light emitting pixel drivers EPD. The light emitting pixel drivers EPD may include the first transistor T1 and two or more of the transistors T2 to T7 electrically connected to the first transistor T1.

As illustrated in FIG. 6, according to embodiments, the first transistor T1 may include the channel portion CH1, the first electrode portion E11, and the second electrode portion E21 disposed in the first semiconductor layer on the substrate 110, and the gate electrode G1 disposed in the first gate conductive layer on the first gate insulating layer 122.

The first electrode portion E11 may be connected to one side of the channel portion CH1, and the second electrode portion E21 may be connected to the other side of the channel portion CH1.

The first electrode portion E11 and the second electrode portion E21 may be doped at a higher concentration than the channel portion CH1.

The gate electrode G1 may overlap the channel portion CH1.

Similarly, the second transistor T2 may include the channel portion CH2, the first electrode portion E12, and the second electrode portion E22 disposed in the first semiconductor layer on the substrate 110, and the gate electrode G2 disposed in the first gate conductive layer on the first gate insulating layer 122 and overlapping the channel portion CH2.

In addition, the six transistor T6 may include the channel portion CH6, the first electrode portion E16, and the second electrode portion E26 disposed in the first semiconductor layer on the substrate 110, and the gate electrode G6 disposed in the first gate conductive layer on the first gate insulating layer 122 and overlapping the channel portion CH6.

The first electrode portion E12 of the second transistor T2 may be electrically connected to the data line DL through the data connection electrode DCE.

The data connection electrode DCE may be disposed in the first source-drain conductive layer on the second interlayer insulating layer 126, and may be electrically connected to the first electrode portion E12 of the second transistor T2 through a data auxiliary connection hole DCAH. The data auxiliary connection hole DCAH may penetrate, i.e., extend entirely through, the second interlayer insulating layer 126, the third gate insulating layer 125, the first interlayer insulating layer 124, the second gate insulating layer 123, and the first gate insulating layer 122.

The data line DL may be disposed in the second source-drain conductive layer on the first planarization layer 127, and may be electrically connected to the data connection electrode DCE through a data connection hole DCH penetrating the first planarization layer 127.

The second electrode portion E22 of the second transistor T2 may be connected to the first electrode portion E11 of the first transistor T1.

The second electrode portion E21 of the first transistor T1 may be connected to the first electrode portion E16 of the sixth transistor T6.

The second electrode portion E26 of the sixth transistor T6 may be electrically connected to an anode electrode 131 through the first anode connection electrode ANCE1 and the second anode connection electrode ANCE2.

The first anode connection electrode ANCE1 may be disposed in the first source-drain conductive layer on the second interlayer insulating layer 126, and may be electrically connected to the second electrode portion E26 of the six transistor T6 through a first anode contact hole ANCH1.

The first anode contact hole ANCH1 may penetrate the second interlayer insulating layer 126, the third gate insulating layer 125, the first interlayer insulating layer 124, the second gate insulating layer 123, and the first gate insulating layer 122.

The second anode connection electrode ANCE2 may be disposed on the second source-drain conductive layer on the first planarization layer 127, and electrically connected to the first anode connection electrode ANCE1 through a second anode contact hole ANCH2 penetrating the first planarization layer 127.

The anode electrode 131 may be disposed on the second planarization layer 128, and may be electrically connected to the second anode connection electrode ANCE2 through a third anode contact hole ANCH3 penetrating the second planarization layer 128.

According to embodiments, since the fifth transistor T5 (see FIG. 5), and the seventh transistor T7 (see FIG. 5) have substantially the same structure as the first transistor T1, the second transistor T2, and the sixth transistor T6, redundant description is omitted below.

The first gate conductive layer on the first gate insulating layer 122 may include the gate electrode of each of the first transistor T1, the second transistor T2, the fifth transistor T5, the sixth transistor T6, and the seventh transistor T7.

The first gate conductive layer on the first gate insulating layer 122 may further include the scan write line GWL electrically connected to the gate electrode G2 of the second transistor T2, and the bias control line GBL electrically connected to the gate electrode of the seventh transistor T7.

Additionally, the first gate conductive layer may further include the scan initialization line GIL extending in the first direction DR1.

Additionally, the first gate conductive layer may further include the emission control line ECL electrically connected to the gate electrode of the fifth transistor T5 and the gate electrode of the sixth transistor T6.

According to embodiments, the circuit layer 120 may further include the capacitor electrode CAE that overlaps the gate electrode G1 of the first transistor T1.

The capacitor electrode CAE may be disposed in the second gate conductive layer on the second gate insulating layer 123.

The capacitor electrode CAE may be electrically connected to the first power line VDL (see FIG. 5).

As a result, due to the overlapping area between the gate electrode G1 of the first transistor T1 and the capacitor electrode CAE, the first pixel capacitor PC1 may be provided between the gate electrode G1 of the first transistor T1 and the first power line VDL (see FIG. 5).

According to embodiments, unlike the fact that the first transistor T1, the second transistor T2, and the sixth transistor T6 are N-type MOSFETs, the fourth transistor T4 may be a P-type MOSFET.

Accordingly, the fourth transistor T4 may include the channel portion CH4, the first electrode portion E14, and the second electrode portion E24 disposed in the second semiconductor layer on the first interlayer insulating layer 124, and the gate electrode G4 disposed in the third gate conductive layer on the third gate insulating layer 125 and overlapping the channel portion CH4.

The fourth transistor T4 may further include the second light blocking portion LB2 disposed below the channel portion CH4 and overlapping the channel portion CH4.

The second light blocking portion LB2 may be a bottom gate electrode electrically connected to the gate electrode G4.

For example, the second light blocking portion LB2 may be a part of the scan initialization line GIL.

The scan initialization line GIL may be disposed in the second gate conductive layer on the second gate insulating layer 123.

According to embodiments, since the third transistor T3 has substantially the same structure as the fourth transistor T4, duplicate description will be omitted below.

The first electrode portion E14 of the fourth transistor T4 may be electrically connected to the first initialization voltage line VIL (see FIG. 5) through a second connection electrode CNE2.

The second connection electrode CNE2 may be disposed in the first source-drain conductive layer on the second interlayer insulating layer 126.

The second connection electrode CNE2 may be electrically connected to the first electrode portion E14 of the fourth transistor T4 in the second semiconductor layer on the first interlayer insulating layer 124 through a first connection hole CNH12.

The element layer 130 may be disposed on the circuit layer 120, and may include the light emitting elements LE respectively corresponding to the emission areas EA.

Each of the light emitting elements LE may include the anode electrode 131 and a cathode electrode 134 facing each other, and a light emitting layer 133 disposed therebetween.

That is, the element layer 130 may include the anode electrodes 131 respectively corresponding to the emission areas EA, a pixel defining layer 132 corresponding to a non-emission area NEA and covering the edge of the anode electrode 131, light emitting layers 133 respectively disposed on the anode electrodes 131, and the cathode electrode 134 disposed on the light emitting layers 133 and the pixel defining layer 132.

In an embodiment, each of the light emitting elements LE may further include a first common layer disposed between the anode electrode 131 and the light emitting layer 133, and a second common layer disposed between the light emitting layer 133 and the cathode electrode 134.

The anode electrode 131 may be disposed in each of the emission areas EA and may be electrically connected to one light emitting pixel driver EPD of the circuit layer 120. This anode electrode 131 may be referred to as a pixel electrode.

The anode electrode 131 may be electrically connected to the second anode connection electrode ANCE2 through the third anode contact hole ANCH3 penetrating the second planarization layer 128.

The light emitting layer 133 may include an organic light emitting material that converts electron-hole pairs into light.

The cathode electrode 134 may be disposed in the display area DA including the emission areas EA. The second power ELVSS may be commonly applied to the cathode electrode 134. The cathode electrode 134 may be referred to as a common electrode.

The encapsulation layer 140 may be disposed on the circuit layer 120 and cover the element layer 130.

As an example, the encapsulation layer 140 may include a first encapsulation layer disposed on the element layer 130 and made of an inorganic insulating material, a second encapsulation layer disposed on the first encapsulation layer, overlapping the element layer 130, and made of an organic insulating material, and a third encapsulation layer disposed on the first encapsulation layer, covering the second encapsulation layer, and made of an inorganic insulating material.

According to embodiments, in order to reduce the number of mask processes and integrate the light emitting pixel driver EPD, the circuit layer 120 may include at least one connection electrode CNE1 and CNE2 (see FIG. 7) disposed on the first source-drain conductive layer on the second interlayer insulating layer 126.

Figure 8:
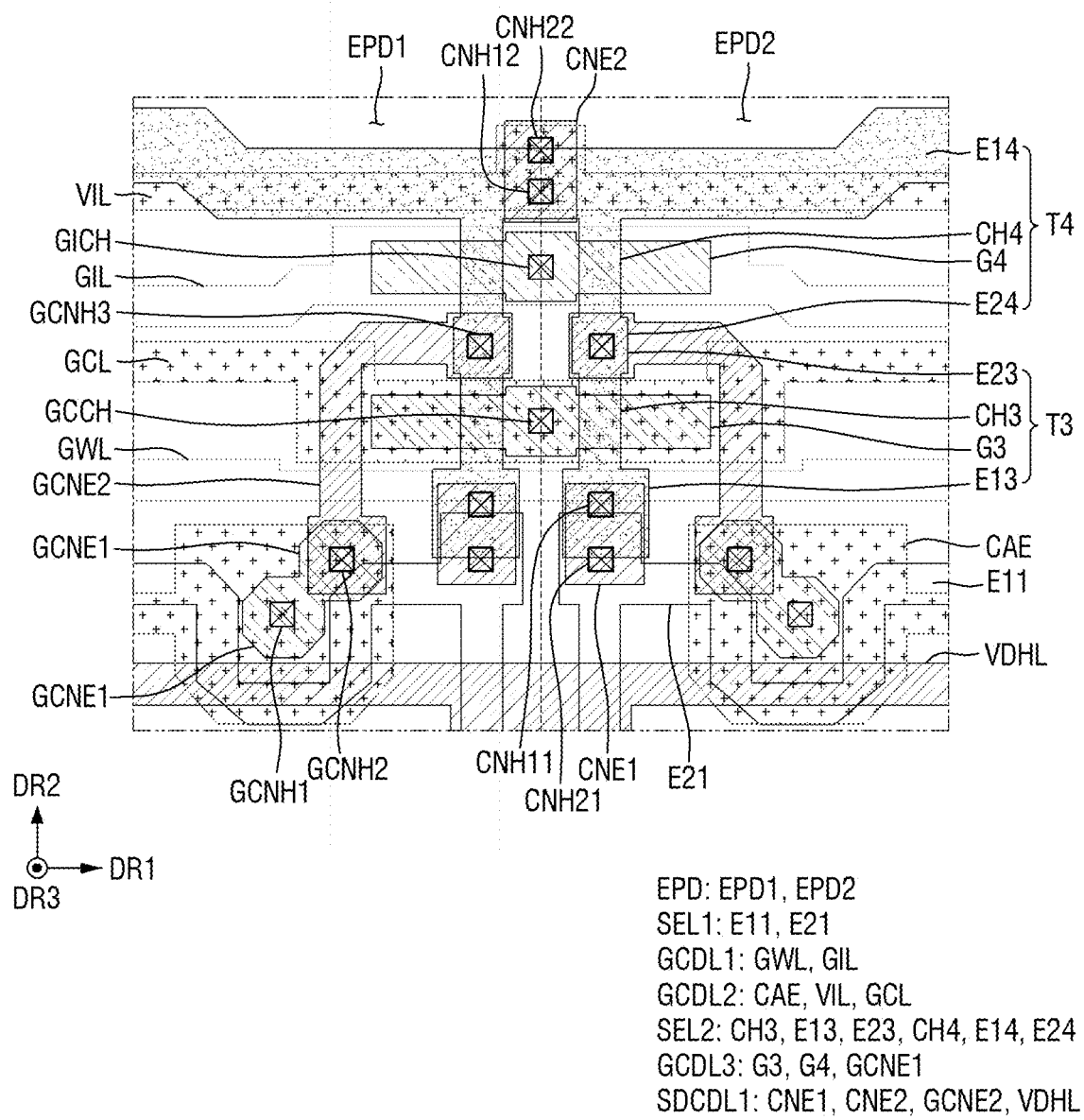
Figure 9:
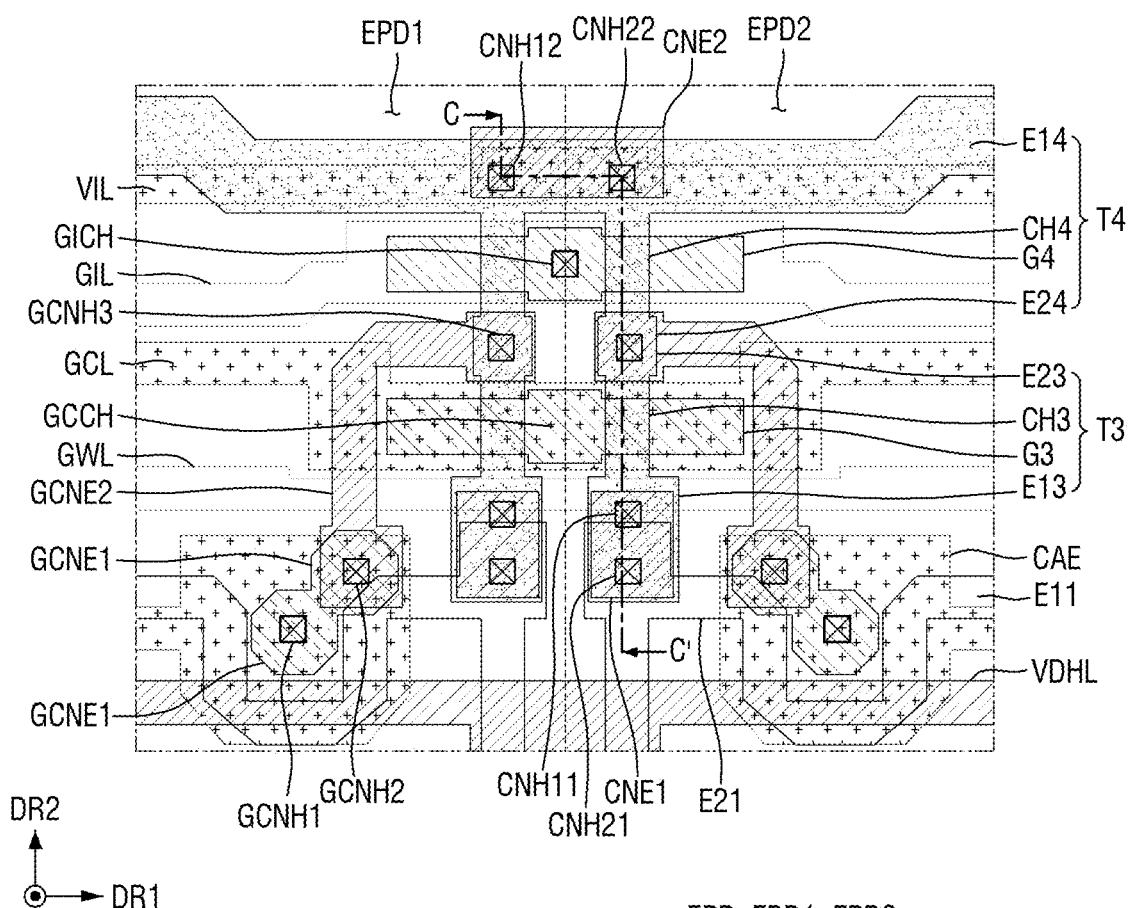
Figure 10:
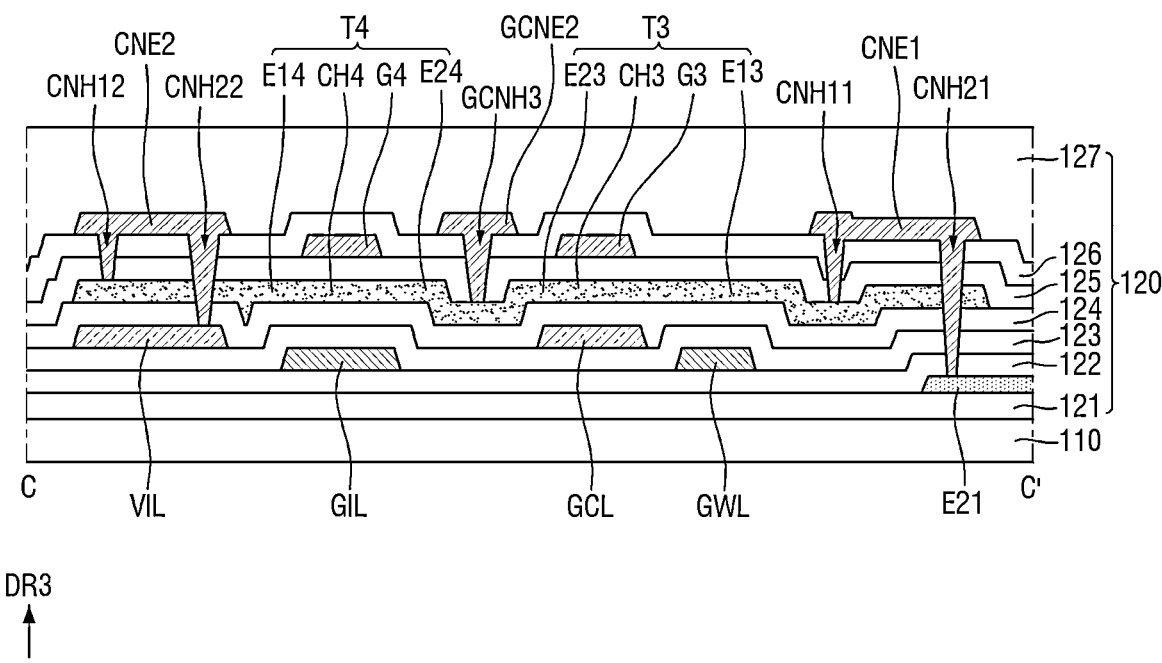
FIG. 10 is a cross-sectional view taken along line C-C' of FIG. 9.

FIGS. 7, 8, and 9 are plan views illustrating a third transistor and a fourth transistor of adjacent light emitting pixel drivers according to embodiments. FIG. 10 is a cross-sectional view taken along line C-C' of FIG. 9.

As illustrated in FIGS. 7, 8, and 9, the circuit layer 120 may include the first semiconductor layer SEL1, a first gate conductive layer GCDL1, a second gate conductive layer GCDL2, the second semiconductor layer SEL2, a third gate conductive layer GCDL3, and a first source-drain conductive layer SDCDL1.

The first semiconductor layer SEL1 on the substrate 110 (see FIGS. 6 and 10) may include a channel portion, a first electrode portion, and a second electrode portion of P-type MOSFETs.

That is, the first semiconductor layer SEL1 may include the first electrode portion E11 and the second electrode portion E21 of the first transistor T1 disposed as a P-type MOSFET.

The first gate conductive layer GCDL1 on the first gate insulating layer 122 (see FIGS. 6 and 10) may include gate electrodes of P-type MOSFETs and signal lines extending in the first direction DR1.

As an example, the first gate conductive layer GCDL1 may include the scan write line GWL electrically connected to the gate electrode of the second transistor T2, and the scan initialization line GIL electrically connected to the gate electrode of the fourth transistor T4.

The second gate conductive layer GCDL2 on the second gate insulating layer 123 (see FIGS. 6 and 10) may include the capacitor electrode CAE that overlaps the gate electrode G1 (see FIG. 6) of the first transistor T1.

As illustrated in FIG. 10, the second gate conductive layer GCDL2 on the second gate insulating layer 123 may further include the first initialization voltage line VIL and the gate control line GCL.

As illustrated in FIG. 7, each of the first initialization voltage line VIL and the gate control line GCL may extend in the first direction DR1.

As illustrated in FIG. 10, the second semiconductor layer SEL2 (see FIG. 7) on the first interlayer insulating layer 124 may include channel portions CH3 and CH4, first electrode portions E13 and E14, and second electrode portions E23 and E24 of the third transistor T3 and the fourth transistor T4 disposed as N-type MOFSETs.

The channel portion CH3 of the third transistor T3 may overlap the gate control line GCL.

A portion of the gate control line GCL overlapping the channel portion CH3 of the third transistor T3 may be a second light blocking portion of the third transistor T3.

The first electrode portion E13 of the third transistor T3 may be disposed adjacent to the second electrode portion E21 of the first transistor T1.

The channel portion CH4 of the fourth transistor T4 may overlap the scan initialization line GIL.

A portion of the scan initialization line GIL overlapping the channel portion CH4 of the fourth transistor T4 may be a second light blocking portion of the fourth transistor T4.

As illustrated in FIGS. 7 and 10, the first electrode portion E14 of the fourth transistor T4 may be disposed adjacent to the first initialization voltage line VIL.

The second electrode portion E23 of the third transistor T3 and the second electrode portion E24 of the fourth transistor T4 may be connected to each other.

As illustrated in FIG. 7, the light emitting pixel drivers EPD may include a first light emitting pixel driver EPD1 and a second light emitting pixel driver EPD2 adjacent to each other in the first direction DR1.

The first electrode portion E14 of the fourth transistor T4 of the first light emitting pixel driver EPD1 and the first electrode portion E14 of the fourth transistor T4 of the second light emitting pixel driver EPD2 may be connected to each other.

In this way, for electrical connection between the first electrode portion E14 of the fourth transistor T4 and the first initialization voltage line VIL, a first connection hole CNH11 reaching the first electrode portion E14 of the fourth transistor T4 may be disposed in only one of the first light emitting pixel driver EPD1 and the second light emitting pixel driver EPD2 adjacent to each other in the first direction DR1. Accordingly, the width of each of the light emitting pixel drivers EPD may be reduced.

As illustrated in FIG. 10, the third gate conductive layer GCDL3 (see FIG. 7) on the third gate insulating layer 125 may include the gate electrodes G3 and G4 of the third transistor T3 and the fourth transistor T4 disposed as N-type MOFSETs.

As illustrated in FIG. 7, the gate electrode G3 of the third transistor T3 may overlap the gate control line GCL and may be electrically connected to the gate control line GCL through a gate control connection hole GCCH.

The gate control connection hole GCCH may penetrate the first interlayer insulating layer 124 (see FIG. 6) and the third gate insulating layer 125 (see FIG. 6).

The gate electrode G3 of the third transistor T3 of the first light emitting pixel driver EPD1 and the gate electrode G3 of the third transistor T3 of the second light emitting pixel driver EPD2 may be connected to each other.

Accordingly, the gate control connection hole GCCH may be disposed only in one of the first light emitting pixel driver EPD1 and the second light emitting pixel driver EPD2 adjacent to each other in the first direction DR1. Accordingly, the width of each of the light emitting pixel drivers EPD may be reduced.

The gate electrode G4 of the fourth transistor T4 may overlap the scan initialization line GIL and may be electrically connected to the scan initialization line GIL through a scan initialization connection hole GICH.

The scan initialization connection hole GICH may penetrate the second gate insulating layer 123 (see FIGS. 6 and 10), the first interlayer insulating layer 124 (see FIGS. 6 and 10), and the third gate insulating layer 125 (see FIGS. 6 and 10).

The gate electrode G4 of the fourth transistor T4 of the first light emitting pixel driver EPD1 and the gate electrode G4 of the fourth transistor T4 of the second light emitting pixel driver EPD2 may be connected to each other.

Accordingly, the scan initialization connection hole GICH may be disposed only in one of the first light emitting pixel driver EPD1 and the second light emitting pixel driver EPD2 adjacent to each other in the first direction DR1. Accordingly, the width of each of the light emitting pixel drivers EPD may be reduced.

Additionally, the third gate conductive layer GCDL3 may further include a first gate connection electrode GCNE1.

As illustrated in FIG. 10, one end of a second gate connection electrode GCNE2 may be electrically connected to the second electrode portion E23 of the third transistor T3 and the second electrode portion E24 of the fourth transistor T4 through a third gate connection hole GCNH3.

The third gate connection hole GCNH3 may penetrate the second interlayer insulating layer 126 and the third gate insulating layer 125.

As illustrated in FIG. 7, the other end of the second gate connection electrode GCNE2 may overlap the first gate connection electrode GCNE1 and may be electrically connected to the first gate connection electrode GCNE1 through a second gate connection hole GCNH2.

The first gate connection electrode GCNE1 may be disposed on the first source-drain conductive layer SDCDL1 on the second interlayer insulating layer 126 (see FIGS. 6 and 10).

The second gate connection hole GCNH2 may penetrate the second interlayer insulating layer 126 (see FIG. 6).

The second gate connection electrode GCNE2 may be electrically connected to the gate electrode G1 (see FIG. 6) of the first transistor T1 through a first gate connection hole GCNH1.

The first gate connection hole GCNH1 may be disposed in the opening of the capacitor electrode CAE, may penetrate the second interlayer insulating layer 126 (see FIG. 6), the third gate insulating layer 125 (see FIG. 6), the second semiconductor layer SEL2, the first interlayer insulating layer 124 (see FIG. 6), and the second gate insulating layer 123 (see FIG. 6), and may reach the gate electrode G1 (see FIG. 6) of the first transistor T1.

According to embodiments, the first source-drain conductive layer SDCDL1 on the second interlayer insulating layer 126 (see FIG. 6) may further include a first power horizontal line VDHL.

The first power horizontal line VDHL may extend in the first direction DR1 and may overlap a part of the capacitor electrode CAE.

The first power horizontal line VDHL may be electrically connected to the capacitor electrode CAE.

According to embodiments, the first source-drain conductive layer SDCDL1 on the second interlayer insulating layer 126 (see FIGS. 6 and 10) may further include at least one connection electrode CNE1 and CNE2.

That is, according to embodiments, the circuit layer 120 may include at least one connection electrode CNE1 and CNE2 disposed on the first source-drain conductive layer SDCDL1.

At least one connection electrode CNE1 and CNE2 may each electrically connect one of the first semiconductor layer SEL1, the first gate conductive layer GCDL1, and the second gate conductive layer GCDL2 disposed under the first interlayer insulating layer 124 (see FIGS. 6 and 10), to the second semiconductor layer SEL2.

At least one connection electrode CNE1 and CNE2 may be electrically connected to the second semiconductor layer SEL2 through the first connection holes CNH11 and CNH12, respectively.

In addition, at least one connection electrode CNE1 and CNE2 may be electrically connected to one of the first semiconductor layer SEL1, the first gate conductive layer GCDL1, and the second gate conductive layer GCDL2 disposed under the first interlayer insulating layer 124 (see FIGS. 6 and 10) through the second connection holes CNH21 and CNH22, respectively.

According to embodiments, the second connection holes CNH21 and CNH22 may overlap at least a part of the second semiconductor layer SEL2 and may penetrate the second semiconductor layer SEL2.

That is, at least one connection electrode CNE1 and CNE2 may be electrically connected to the second semiconductor layer SEL2 not only through the first connection holes CNH11 and CNH12 reaching the second semiconductor layer SEL2, but also through the second connection holes CNH21 and CNH22 penetrating at least a part of the second semiconductor layer SEL2 until it reaches one of the first semiconductor layer SEL1, the first gate conductive layer GCDL1, and the second gate conductive layer GCDL2.

In this way, the separation distance between the first connection holes CNH11 and CNH12 and the second connection holes CNH21 and CNH22 may be reduced, so that the width of at least one connection electrode CNE1 and CNE2 may each be reduced. In addition, as the width of each of at least one connection electrode CNE1 and CNE2 is reduced, the width allocated to the disposition of at least one connection electrode CNE1 and CNE2 in each of the light emitting pixel drivers EPD may be reduced. Accordingly, the width of each of the light emitting pixel drivers EPD may be reduced, which may be advantageous for the high resolution of the display device 100.

As illustrated in FIGS. 7 and 10, at least one connection electrode CNE1 and CNE2 may include the first connection electrode CNE1 electrically connecting the first electrode portion E13 of the third transistor T3 to the second electrode portion E21 of the first transistor T1, and the second connection electrode CNE2 electrically connecting the first electrode portion E14 of the fourth transistor T4 to the first initialization voltage line VIL.

The first connection electrode CNE1 may be electrically connected to the first electrode portion E13 of the third transistor T3 through the first connection hole CNH11.

The first connection electrode CNE1 may be electrically connected to the second electrode portion E21 of the first transistor T1 through the second connection hole CNH21.

As illustrated in FIG. 10, the first connection hole CNH11 of the first connection electrode CNE1 may penetrate the second interlayer insulating layer 126 and the third gate insulating layer 125 and may reach the first electrode portion E13 of the third transistor T3 disposed in the second semiconductor layer SEL2 (see FIG. 7).

The second connection hole CNH21 of the first connection electrode CNE1 may penetrate the second interlayer insulating layer 126, the third gate insulating layer 125, the first electrode portion E13 of the third transistor T3 disposed in the second semiconductor layer SEL2 (see FIG. 7), the first interlayer insulating layer 124, the second gate insulating layer 123, and the first gate insulating layer 122, and may reach the second electrode portion E21 of the first transistor T1 disposed in the first semiconductor layer SEL1.

The second connection electrode CNE2 may be electrically connected to the first electrode portion E14 of the fourth transistor T4 through the first connection hole CNH12.

The second connection electrode CNE2 may be electrically connected to the first initialization voltage line VIL through the second connection hole CNH22.

The first connection hole CNH12 of the second connection electrode CNE2 may penetrate the second interlayer insulating layer 126 and the third gate insulating layer 125 and may reach the first electrode portion E14 of the fourth transistor T4 disposed in the second semiconductor layer SEL2 (see FIG. 7).

The second connection hole CNH22 of the second connection electrode CNE2 may penetrate the second interlayer insulating layer 126, the third gate insulating layer 125, the first electrode portion E14 of the fourth transistor T4 disposed in the second semiconductor layer SEL2 (see FIG. 7), and the first interlayer insulating layer 124, and may reach the first initialization voltage line VIL disposed on the second gate conductive layer GCDL2 (see FIG. 7).

As illustrated in FIGS. 7, 8, and 9, according to embodiments, the first connection holes CNH11 and CNH12 may be spaced apart from the second connection holes CNH21 and CNH22.

The first connection hole CNH11 of the first connection electrode CNE1 may be spaced apart from the second connection hole CNH21 of the first connection electrode CNE1 in the second direction DR2.

The second connection hole CNH21 of the first connection electrode CNE1 may overlap a portion of the first electrode portion E13 of the third transistor T3 disposed in the second semiconductor layer SEL2.

According to an embodiment of FIG. 7, the first connection hole CNH12 of the second connection electrode CNE2 may be spaced apart from the second connection hole CNH22 of the second connection electrode CNE2 in a diagonal direction oblique to the first direction DR1 and the second direction DR2.

According to an embodiment of FIG. 7, the first connection hole CNH12 of the second connection electrode CNE2 may overlap a portion of the first electrode portion E14 of the fourth transistor T4 disposed in the second semiconductor layer SEL2.

As illustrated in FIG. 8, according to an embodiment, the first connection hole CNH12 of the second connection electrode CNE2 may be spaced apart from the second connection hole CNH22 of the second connection electrode CNE2 in the second direction DR2.

Since an embodiment of FIG. 8 is substantially the same as an embodiment of FIG. 7 except for the separation direction between the first connection hole CNH12 of the second connection electrode CNE2 and the second connection hole CNH22 of the second connection electrode CNE2, redundant description will be omitted below.

According to an embodiment of FIG. 8, the first connection hole CNH12 of the second connection electrode CNE2 and the second connection hole CNH22 of the second connection electrode CNE2 may overlap the boundary between the first light emitting pixel driver EPD1 and the second light emitting pixel driver EPD2 and may be disposed side by side in the second direction DR2.

The scan initialization connection hole GICH may also overlap the boundary between the first light emitting pixel driver EPD1 and the second light emitting pixel driver EPD2.

For example, the first connection hole CNH12 of the second connection electrode CNE2 may be disposed between the second connection hole CNH22 of the second connection electrode CNE2 and the scan initialization connection hole GICH in the second direction DR2.

In this way, symmetry between the first light emitting pixel driver EPD1 and the second light emitting pixel driver EPD2 may be maintained, so that a decrease in image quality depending on the field of view may be prevented.

As illustrated in FIG. 9, according to an embodiment, the first connection hole CNH12 of the second connection electrode CNE2 may be spaced apart from the second connection hole CNH22 of the second connection electrode CNE2 in the first direction DR1.

Since an embodiment of FIG. 9 is substantially the same as an embodiment of FIG. 7 except for the separation direction between the first connection hole CNH12 of the second connection electrode CNE2 and the second connection hole CNH22 of the second connection electrode CNE2, redundant description will be omitted below.

According to an embodiment of FIG. 9, the second connection hole CNH22 of the second connection electrode CNE2 may be disposed side by side with the first connection hole CNH12 of the second connection electrode CNE2 in the first direction DR1 and thus may entirely overlap the second semiconductor layer SEL2.

As an example, the first connection hole CNH12 of the second connection electrode CNE2 may be disposed in one of the first light emitting pixel driver EPD1 and the second light emitting pixel driver EPD2, and the second connection hole CNH22 of the second connection electrode CNE2 may be disposed in the other one of the first light emitting pixel driver EPD1 and the second light emitting pixel driver EPD2.

The distance that the first connection hole CNH12 of the second connection electrode CNE2 is separated from the boundary between the first light emitting pixel driver EPD1 and the second light emitting pixel driver EPD2 may be in the same range as the distance that the second connection hole CNH22 of the second connection electrode CNE2 is separated from the boundary between the first light emitting pixel driver EPD1 and the second light emitting pixel driver EPD2.

In this way, symmetry between the first light emitting pixel driver EPD1 and the second light emitting pixel driver EPD2 may be maintained, so that a decrease in image quality depending on the field of view may be prevented.

Figure 11:
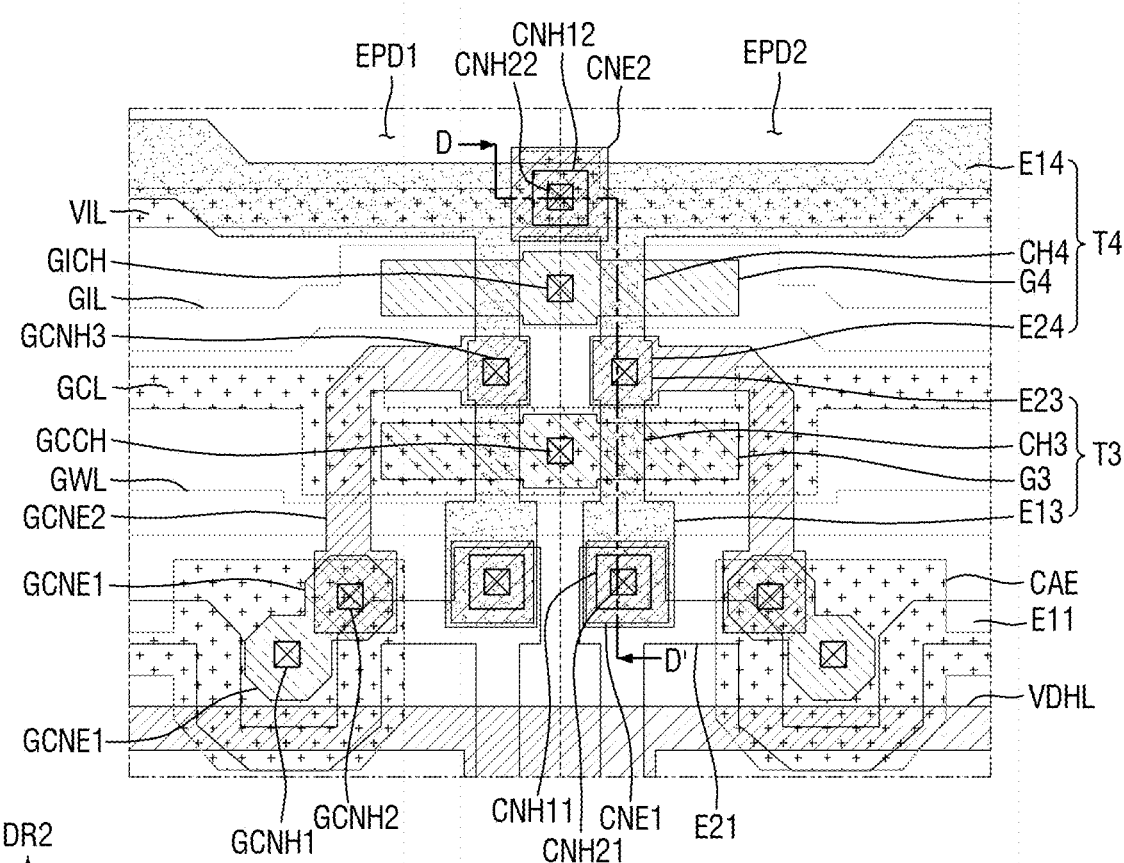
FIG. 11 is a plan view illustrating the third transistor and the fourth transistor of the adjacent light emitting pixel drivers according to an embodiment.
Figure 12:
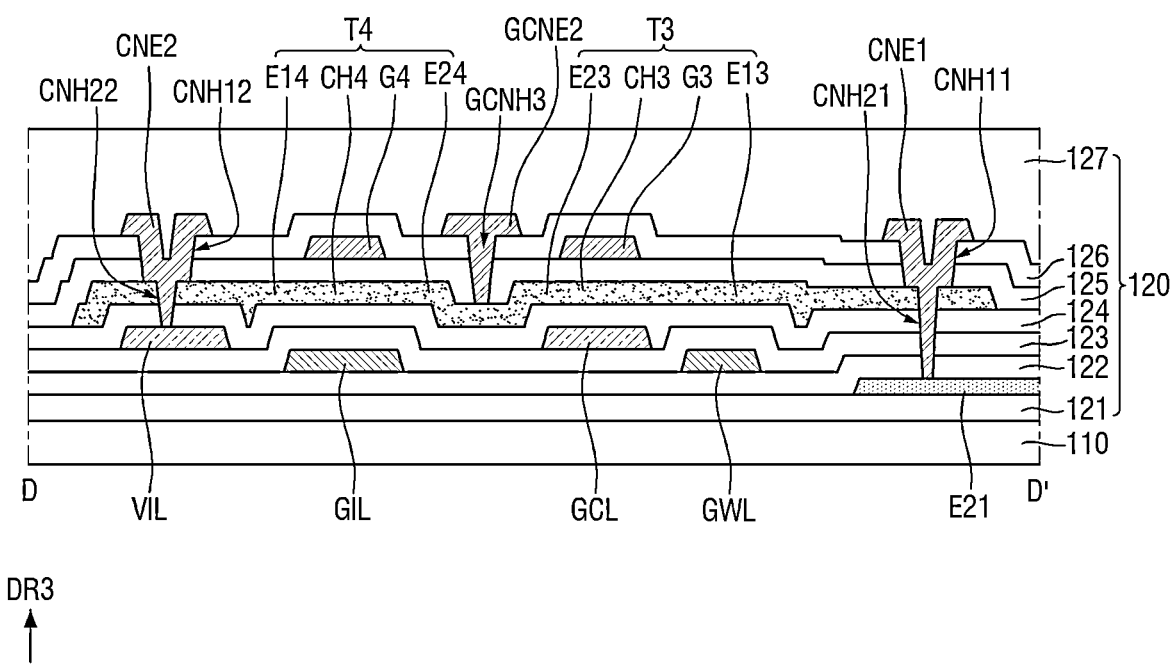
FIG. 12 is a cross-sectional view taken along line D-D' of FIG. 11.

FIG. 11 is a plan view illustrating the third transistor and the fourth transistor of the adjacent light emitting pixel drivers according to an embodiment. FIG. 12 is a cross-sectional view taken along line D-D' of FIG. 11.

According to an embodiment illustrated in FIGS. 11 and 12, the second connection holes CNH21 and CNH22 may overlap a part of the center of the first connection holes CNH11 and CNH12.

The first connection hole CNH11 of the first connection electrode CNE1 may penetrate the second interlayer insulating layer 126 and the third gate insulating layer 125 and may reach the first electrode portion E13 of the third transistor T3 disposed in the second semiconductor layer SEL2 (see FIG. 11).

The second connection hole CNH21 of the first connection electrode CNE1 may overlap a part of the first connection hole CNH11 of the first connection electrode CNE1.

The second connection hole CNH21 of the first connection electrode CNE1 may penetrate the first electrode portion E13 of the third transistor T3 disposed in the second semiconductor layer SEL2 (see FIG. 11), the first interlayer insulating layer 124, the second gate insulating layer 123, and the first gate insulating layer 122, and may reach the second electrode portion E21 of the first transistor T1 disposed in the first semiconductor layer SEL1 (see FIG. 11).

The first connection hole CNH12 of the second connection electrode CNE2 may penetrate the second interlayer insulating layer 126 and the third gate insulating layer 125 and may reach the first electrode portion E14 of the fourth transistor T4 disposed in the second semiconductor layer SEL2 (see FIG. 11).

The second connection hole CNH22 of the second connection electrode CNE2 may overlap a part of the first connection hole CNH12 of the second connection electrode CNE2.

The second connection hole CNH22 of the second connection electrode CNE2 may penetrate the first electrode portion E14 of the fourth transistor T4 disposed in the second semiconductor layer SEL2 (see FIG. 11) and the first interlayer insulating layer 124, and may reach the first initialization voltage line VIL disposed on the second gate conductive layer GCDL2 (see FIG. 11).

In this way, since the separation distance between the first connection holes CNH11 and CNH12 and the second connection holes CNH21 and CNH22 converges to 0, the width of at least one connection electrode CNE1 and CNE2 may not need to include the separation distance between the first connection holes CNH11 and CNH12 and the second connection holes CNH21 and CNH22.

The width of at least one connection electrode CNE1 and CNE2 may be greater than or equal to the width of the first connection holes CNH11 and CNH12.

Accordingly, in each of the light emitting pixel drivers EPD, the width allocated to the disposition of at least one connection electrode CNE1 and CNE2 may be further reduced. Accordingly, the width of each of the light emitting pixel drivers EPD may be further reduced, which may be more advantageous for the high resolution of the display device 100.

Figure 13:
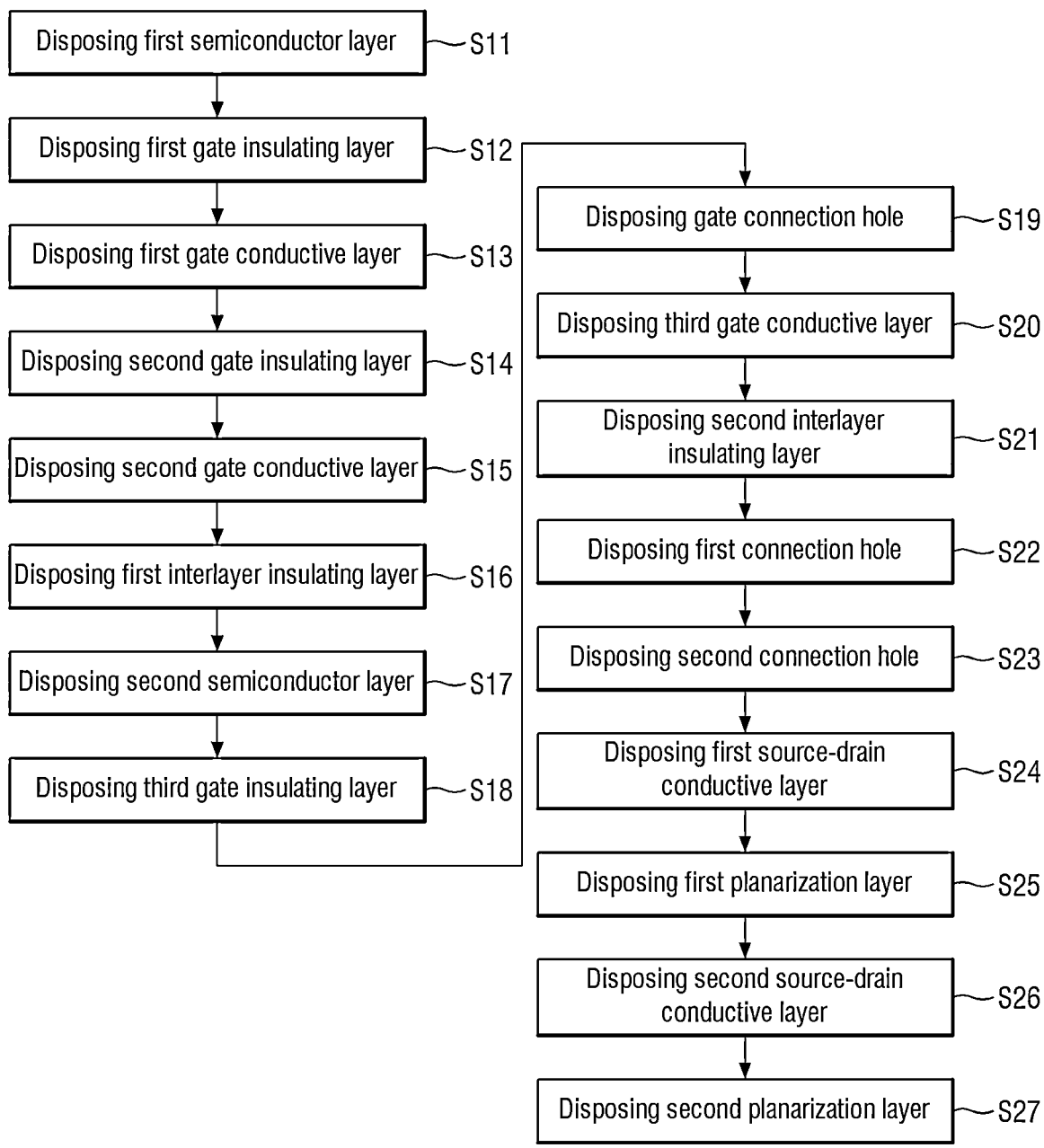
FIG. 13 is a flowchart illustrating a method for fabricating the display device according to embodiments.

FIG. 13 is a flowchart illustrating a method for fabricating the display device according to embodiments. FIGS. 14, 15, 16, 17, 18, 19, 20, 21, 22, 23, 24, 25, 26 and 27 are process diagrams illustrating some steps of FIG. 13.

Referring to FIGS. 3 and 4, a method for fabricating the display device 100 according to embodiments includes a step of preparing the substrate 110 including the display area DA in which the emission areas EA are arranged, and a step of disposing the circuit layer 120 including the light emitting pixel drivers EPD arranged side by side in the first direction DR1 and the second direction DR2.

Additionally, the method for fabricating the display device 100 according to embodiments may further include a step of disposing the element layer 130 on the circuit layer 120.

Referring to FIG. 13, the step of disposing the circuit layer 120 may include disposing the first semiconductor layer SEL1 (see FIG. 11) on the substrate 110 (see FIG. 12) (step S11), disposing the first gate insulating layer 122 (see FIG. 12) covering the first semiconductor layer SEL1 (see FIG. 11) (step S12), disposing the first gate conductive layer GCDL1 (see FIG. 11) on the first gate insulating layer 122 (see FIG. 12) (step S13), disposing the second gate insulating layer 123 (see FIG. 12) covering the first gate conductive layer GCDL1 (see FIG. 11) (step S14), disposing the second gate conductive layer GCDL2 (see FIG. 11) on the second gate insulating layer 123 (see FIG. 12) (step S15), disposing the first interlayer insulating layer 124 (see FIG. 12) covering the second gate conductive layer GCDL2 (see FIG. 11) (step S16), disposing the second semiconductor layer SEL2 (see FIG. 11) on the first interlayer insulating layer 124 (see FIG. 12) (step S17), disposing the third gate insulating layer 125 (see FIG. 12) covering the second semiconductor layer SEL2 (see FIG. 11) (step S18), disposing the third gate conductive layer GCDL3 (see FIG. 11) on the third gate insulating layer 125 (see FIG. 12) (step S20), disposing the second interlayer insulating layer 126 (see FIG. 12) covering the third gate conductive layer GCDL3 (see FIG. 11) (step S21), disposing the first connection holes CNH11 and CNH12 (see FIGS. 11 and 12) reaching the second semiconductor layer SEL2 (see FIG. 11) (step S22), disposing the second connection holes CNH21 and CNH22 (see FIGS. 11 and 12) reaching one of the first semiconductor layer SEL1 (see FIG. 11), the first gate conductive layer GCDL1 (see FIG. 11), and the second gate conductive layer GCDL2 (see FIG. 11) (step S23), and disposing the first source-drain conductive layer SDCDL1 (FIG. 11) on the second interlayer insulating layer 126 (see FIG. 12) (step S24).

According to embodiments, the step of disposing the circuit layer 120 may further include disposing a gate connection hole (step S19) before the step S20 of disposing the third gate conductive layer GCDL3 (see FIG. 11).

According to embodiments, the step of disposing the circuit layer 120 may further include, after the step S24 of disposing the first source-drain conductive layer SDCDL1 (see FIG. 11), disposing the first planarization layer 127 (see FIG. 12) covering the first source-drain conductive layer SDCDL1 (see FIG. 11) (step S25), disposing the second source-drain conductive layer DL and VDL (see FIG. 6) on the first planarization layer 127 (see FIG. 12) (step S26), and disposing the second planarization layer 128 (see FIG. 6) covering the second source-drain conductive layer DL and VDL (see FIG. 6) (step S27).

Figure 14:
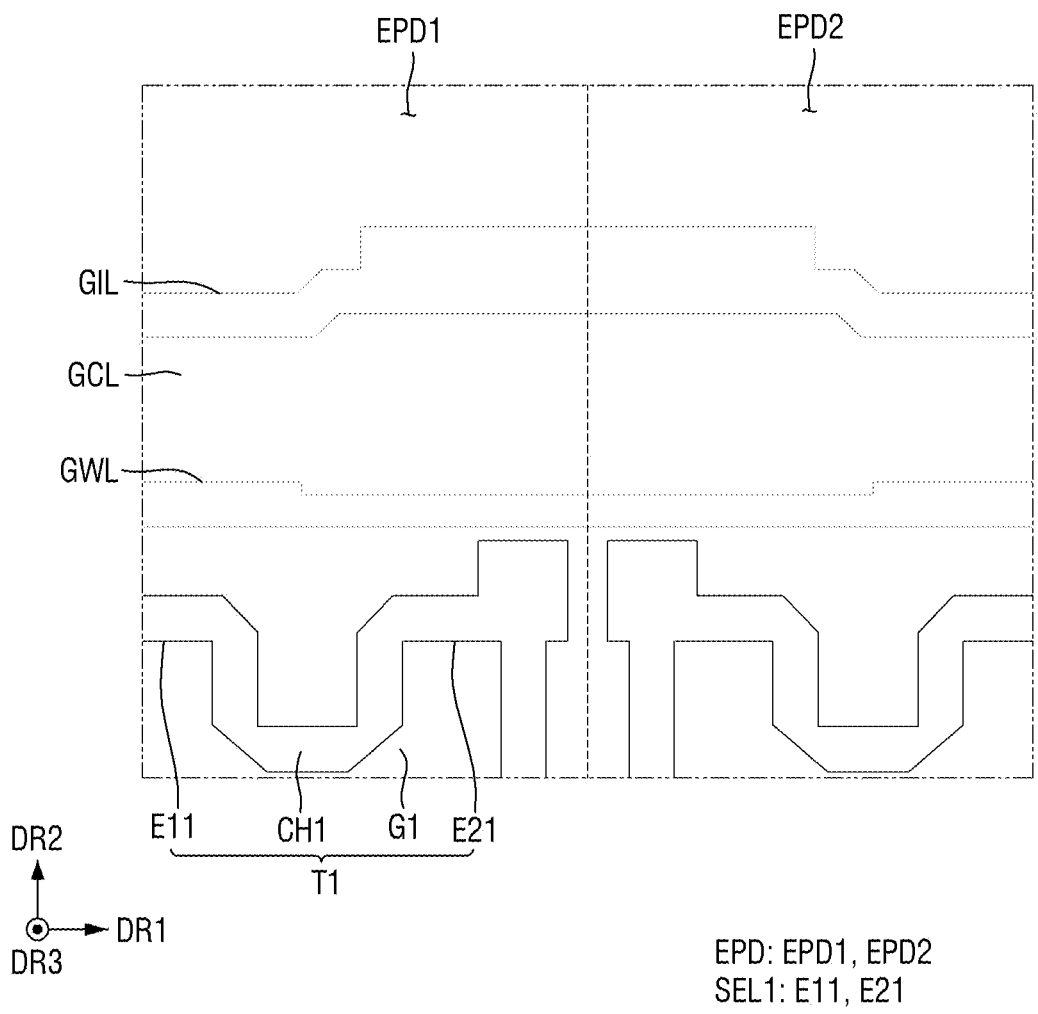
FIGS. 14, 15, 16, 17, 18, 19, 20, 21, 22, 23, 24, 25, 26 and 27 are process diagrams illustrating some steps of FIG. 13.

Referring to FIG. 14, in the step S11 of disposing the first semiconductor layer SEL1, the first semiconductor layer SEL1 may be disposed by partially removing the semiconductor material layer stacked on the substrate 110 (see FIG. 12).

The first semiconductor layer SEL1 may include the channel portion CH1, the first electrode portion E11, and the second electrode portion E21 of the first transistor T1.

The first semiconductor layer SEL1 may further include a channel portion, a first electrode portion, and a second electrode portion of each of the second transistor T2 (see FIG. 5), the fifth transistor T5 (see FIG. 5), the sixth transistor T6 (see FIG. 5), and the seventh transistor T7 (see FIG. 5) that are P-type MOSFETs.

In the step S12 of disposing the first gate insulating layer 122 (see FIG. 12), the first gate insulating layer 122 (see FIG. 12) may be disposed by stacking an inorganic insulating material covering the first semiconductor layer SEL1 on the substrate 110.

In the step S13 of disposing the first gate conductive layer GCDL1 on the first gate insulating layer 122, the first gate conductive layer GCDL1 may be disposed by partially removing a conductive material layer stacked on the first gate insulating layer 122.

The first gate conductive layer GCDL1 may include the gate electrode G1 of the first transistor T1, the scan write line GWL, and the scan initialization line GIL.

The first gate conductive layer GCDL1 may further include a gate electrode of each of the second transistor T2 (see FIG. 5), the fifth transistor T5 (see FIG. 5), the sixth transistor T6 (see FIG. 5), and the seventh transistor T7 (see FIG. 5) that are P-type MOSFETs.

In the step S14 of disposing the second gate insulating layer 123 (see FIG. 12), the second gate insulating layer 123 (see FIG. 12) may be disposed by stacking an inorganic insulating material that covers the first gate conductive layer GCDL1 on the first gate insulating layer 122 (see FIG. 12).

Figure 15:
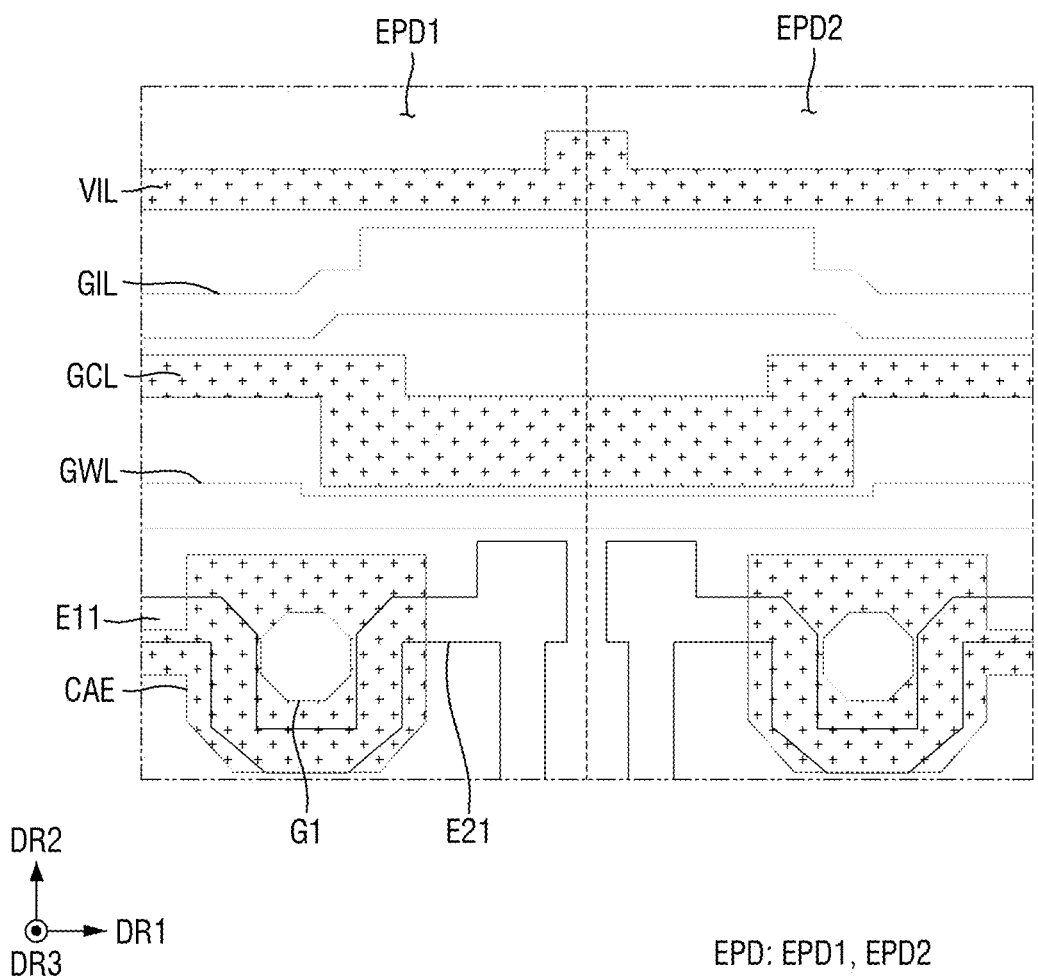

Referring to FIG. 15, in the step S15 of disposing the second gate conductive layer GCDL2 on the second gate insulating layer 123, the second gate conductive layer GCDL2 may be disposed by partially removing a conductive material layer stacked on the second gate insulating layer 123 (see FIG. 12).

The second gate conductive layer GCDL2 may include the capacitor electrode CAE, the first initialization voltage line VIL, and the gate control line GCL.

The capacitor electrode CAE may overlap the gate electrode G1 of the first transistor T1 and may include an opening exposing the gate electrode G1 of the first transistor T1.

In the step S16 of disposing the first interlayer insulating layer 124, the first interlayer insulating layer 124 (see FIG. 12) may be disposed by stacking an inorganic insulating material that covers the second gate conductive layer GCDL2 on the second gate insulating layer 123 (see FIG. 12).

Figure 16:
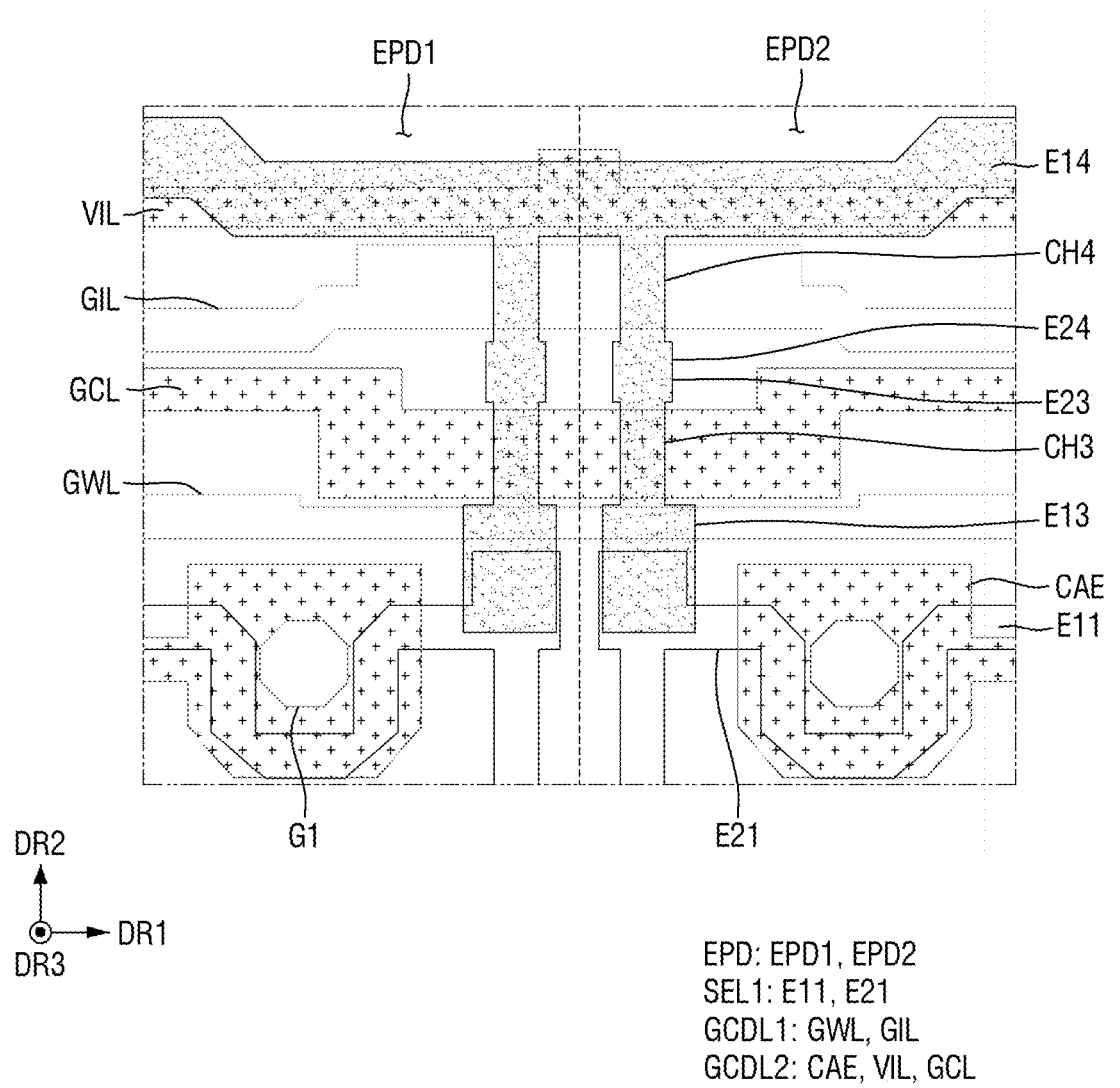

Referring to FIG. 16, in the step S17 of disposing the second semiconductor layer SEL2 on the first interlayer insulating layer 124 (see FIG. 12), the second semiconductor layer SEL2 may be disposed by partially removing a semiconductor material layer stacked on the first interlayer insulating layer 124.

The second semiconductor layer SEL2 may include the channel portions CH3 and CH4, the first electrode portions E13 and E14, and the second electrode portions E23 and E24 of the third transistor T3 (see FIG. 5) and the fourth transistor T4 (see FIG. 5) that are N-type MOSFETs.

The first electrode portion E14 of the fourth transistor T4 of the first light emitting pixel driver EPD1 and the first electrode portion E14 of the fourth transistor T4 of the second light emitting pixel driver EPD2 may be connected to each other.

In the step S18 of disposing the third gate insulating layer 125 (see FIG. 12) covering the second semiconductor layer SEL2, the third gate insulating layer 125 (see FIG. 12) may be disposed by stacking an inorganic insulating material that covers the second semiconductor layer SEL2 on the first interlayer insulating layer 124 (see FIG. 12).

Figure 17:
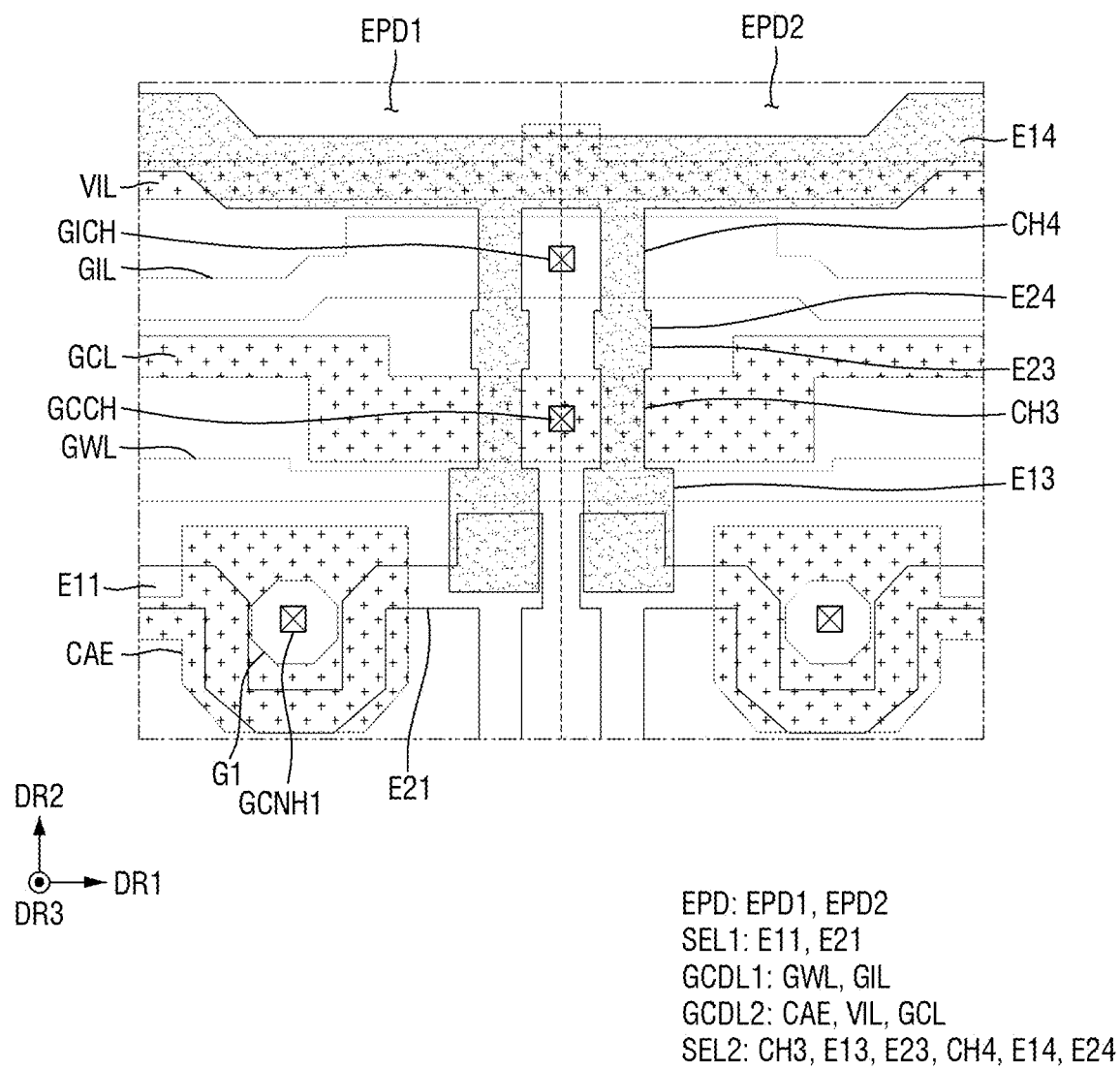

Referring to FIG. 17, in the step S19 of disposing the gate connection hole, the gate connection holes may be disposed by partially etching at least one of the third gate insulating layer 125 (see FIG. 12), the first interlayer insulating layer 124 (see FIG. 12), or the second gate insulating layer 123 (see FIG. 12).

Each of the gate connection holes may reach one of the first gate conductive layer GCDL1 and the second gate conductive layer GCDL2.

The gate connection holes may include the gate control connection hole GCCH that reaches the gate control line GCL, the scan initialization connection hole GICH that reaches the scan initialization line GIL, and the first gate connection hole GCNH1 that reaches the gate electrode G1 of the first transistor T1.

The gate control connection hole GCCH may penetrate the third gate insulating layer 125 (see FIG. 12) and the first interlayer insulating layer 124 (see FIG. 12).

Each of the scan initialization connection hole GICH and the first gate connection hole GCNH1 may penetrate the third gate insulating layer 125 (see FIG. 12), the first interlayer insulating layer 124 (see FIG. 12), and the second gate insulating layer 123 (see FIG. 12).

Figure 18:
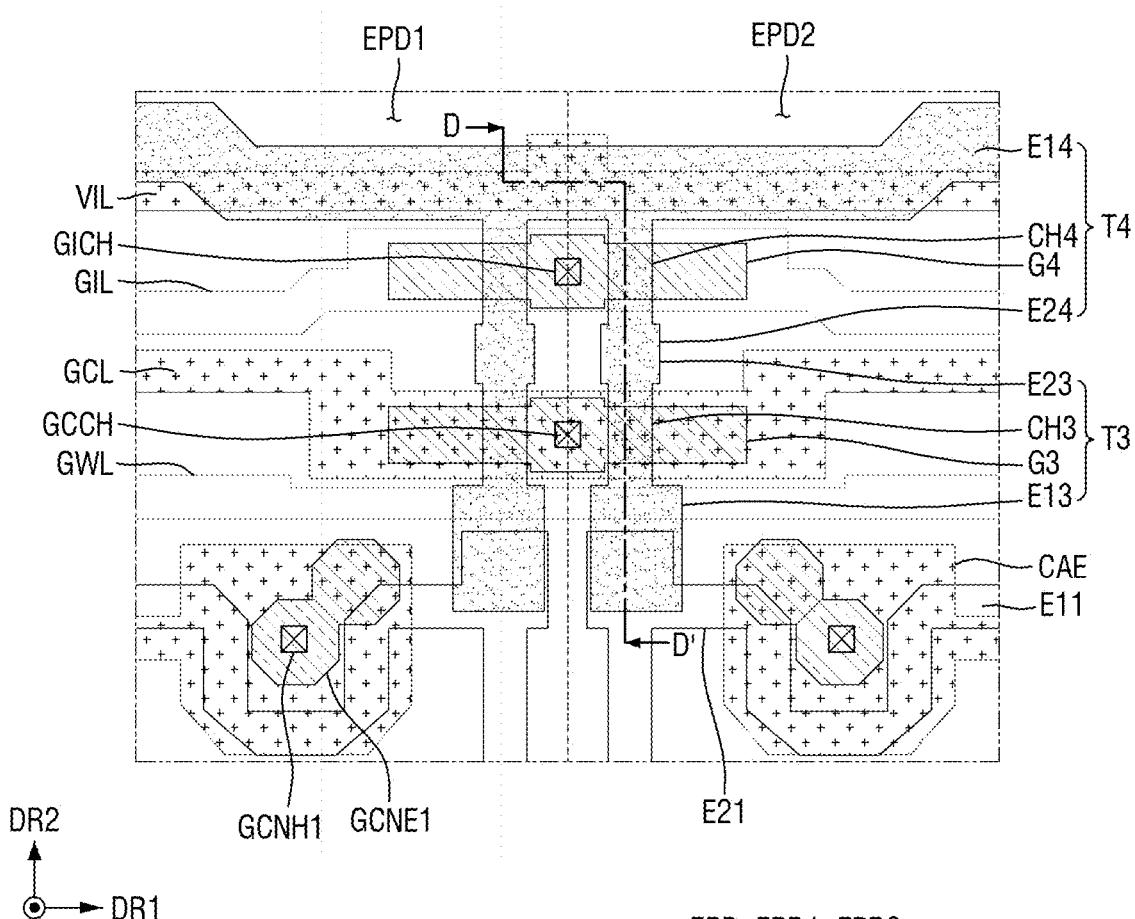
Figure 19:
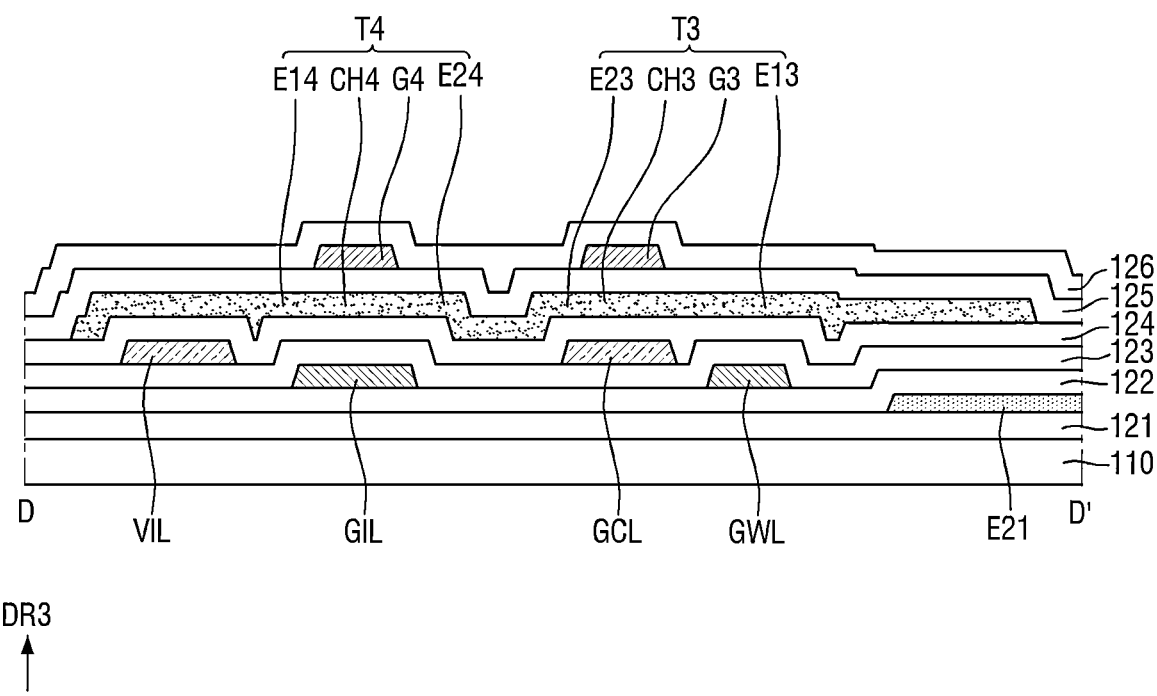

Referring to FIGS. 18 and 19, in the step S20 of disposing the third gate conductive layer GCDL3 on the third gate insulating layer 125 (see FIG. 12), the third gate conductive layer GCDL3 may be disposed by partially removing a conductive material layer stacked on the third gate insulating layer 125 (see FIG. 12).

The third gate conductive layer GCDL3 may include the first gate connection electrode GCNE1 and the gate electrodes G3 and G4 of the third transistor T3 (see FIG. 5) and the fourth transistor T4 (see FIG. 5) that are N-type MOSFETs.

The gate electrode G3 of the third transistor T3 may be electrically connected to the gate control line GCL through the gate control connection hole GCCH.

The gate electrode G4 of the fourth transistor T4 may be electrically connected to the scan initialization line GIL through the scan initialization connection hole GICH.

The first gate connection electrode GCNE1 may be electrically connected to the gate electrode G1 of the first transistor T1 through the first gate connection hole GCNH1.

In the step S21 of disposing the second interlayer insulating layer 126, the second interlayer insulating layer 126 may be disposed by stacking an inorganic insulating material that covers the third gate conductive layer GCDL3 on the third gate insulating layer 125.

Figure 20:
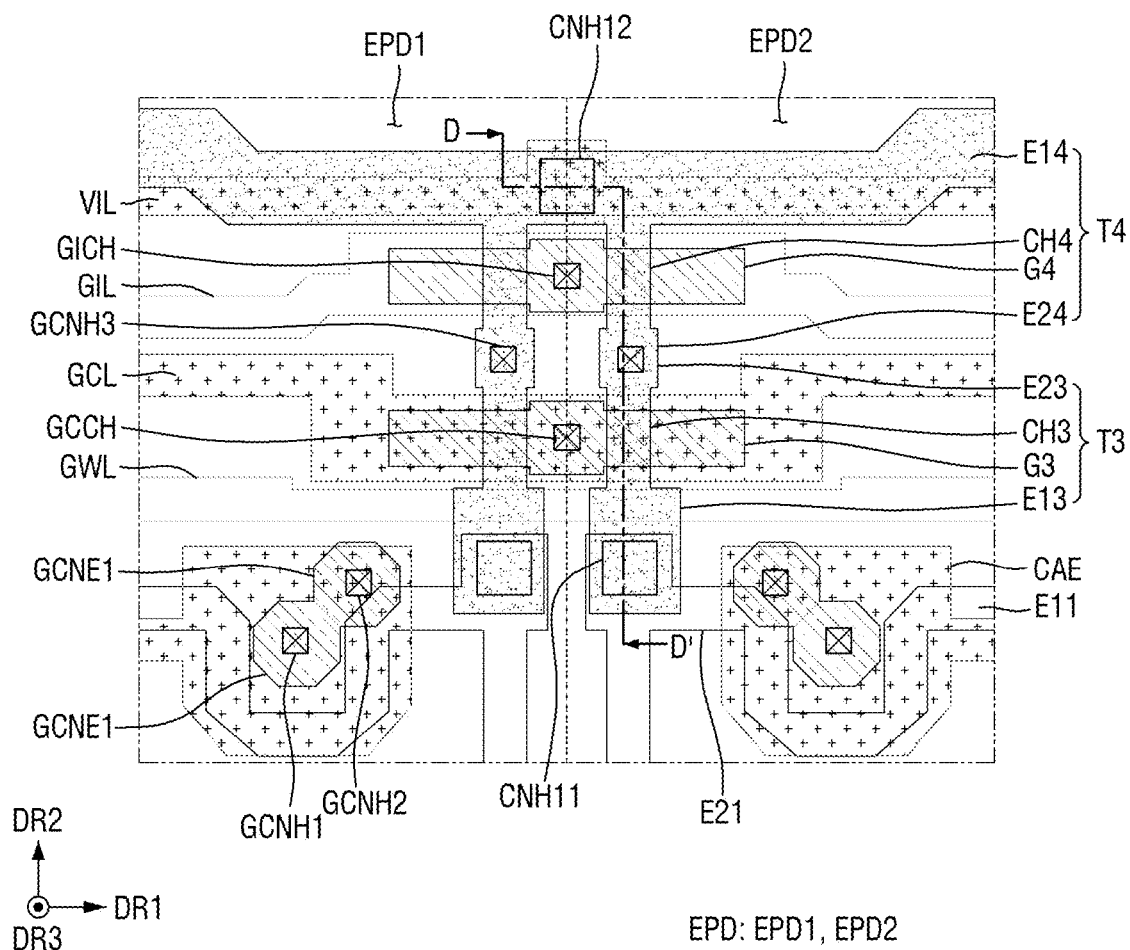
Figure 21:
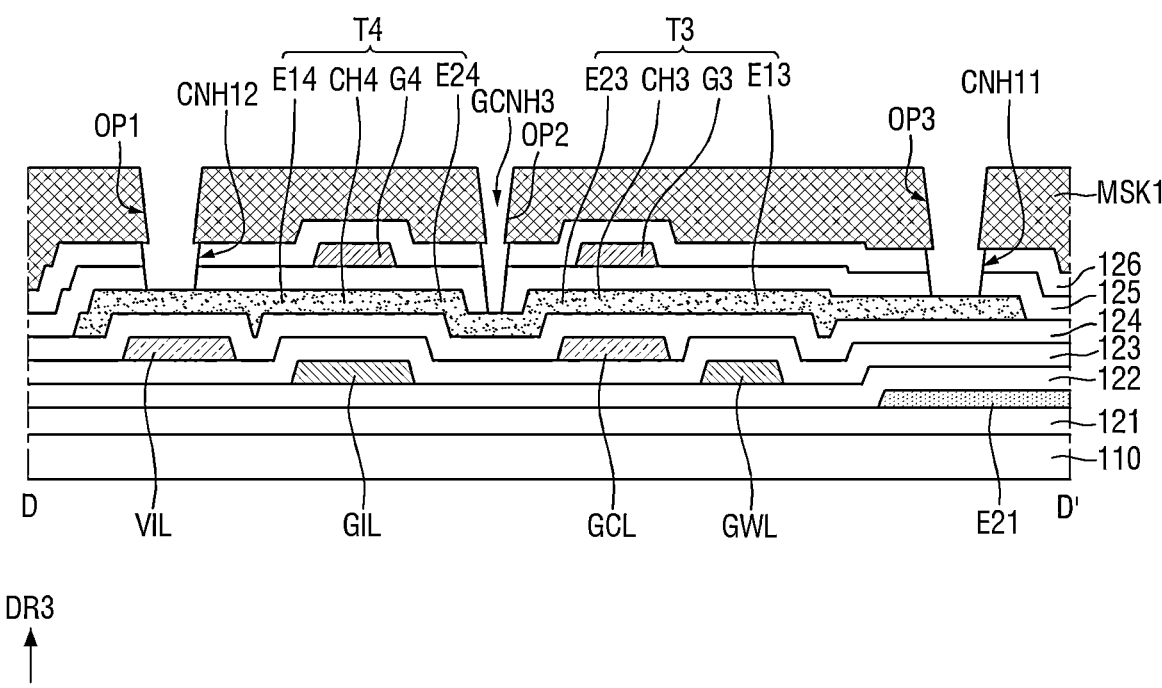

Referring to FIGS. 20 and 21, in the step S22 of disposing the first connection holes CNH11 and CNH12, after disposing a first mask layer MSK1 including openings OP1, OP2, and OP3 on the second interlayer insulating layer 126, the first connection holes CNH11 and CNH12 may be disposed by partially etching the second interlayer insulating layer 126 and the third gate insulating layer 125 through the openings OP1, OP2, and OP3 of the first mask layer MSK1.

One connection hole CNH12 of the first connection holes CNH11 and CNH12 may be provided by the first opening OP1 of the first mask layer MSK1 and may reach the first electrode portion E14 of the fourth transistor T4.

The other connection hole CNH11 of the first connection holes CNH11 and CNH12 may be provided by the third opening OP3 of the first mask layer MSK1 and may reach the first electrode portion E13 of the third transistor T3.

In the step S22 of disposing the first connection holes CNH11 and CNH12, the second gate connection hole GCNH2 and the third gate connection hole GCNH3 may be further disposed.

The second gate connection hole GCNH2 may reach the first gate connection electrode GCNE1.

The third gate connection hole GCNH3 may be provided by the second opening OP2 of the first mask layer MSK1, and may reach the second electrode portion E23 of the third transistor T3 and the second electrode portion E24 of the fourth transistor T4.

Figure 22:
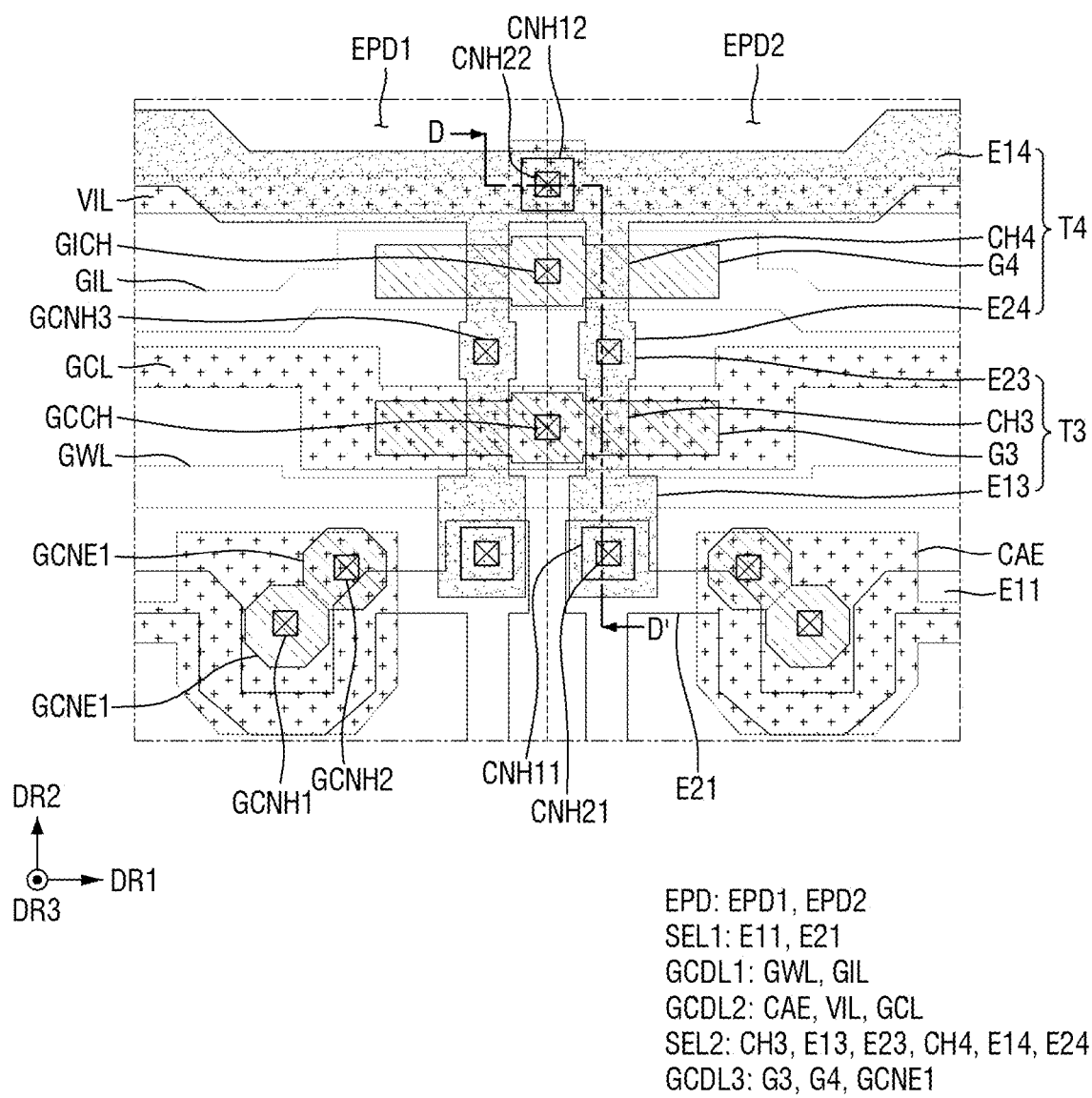
Figure 23:
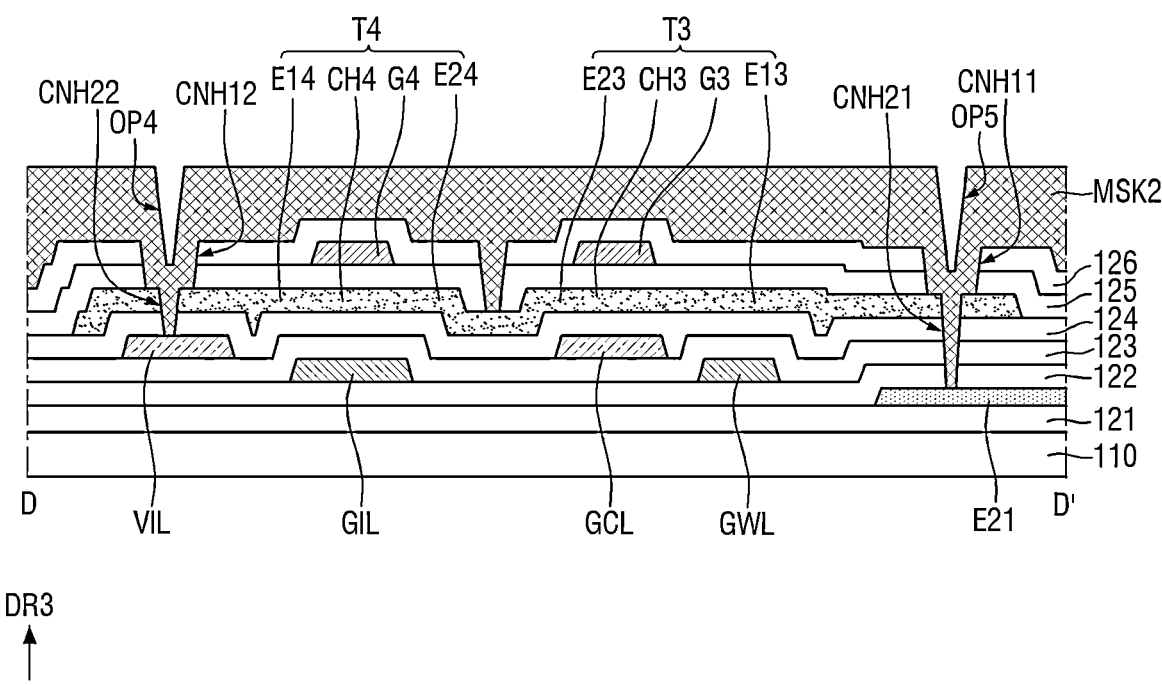

Referring to FIGS. 22 and 23, in the step S23 of disposing the second connection holes CNH21 and CNH22, after removing the first mask layer MSK1 and disposing a second mask layer MSK2 including openings OP4 and OP5 on the second interlayer insulating layer 126, the second connection holes CNH21 and CNH22 may be disposed by partially etching at least one of the second semiconductor layer SEL2, the first interlayer insulating layer 124, the second gate insulating layer 123, or the first gate insulating layer 122 through the openings OP4 and OP5 of the second mask layer MSK2.

One connection hole CNH22 of the second connection holes CNH21 and CNH22 may be provided by the fourth opening OP4 of the second mask layer MSK2, and may reach the first initialization voltage line VIL disposed on the second gate conductive layer GCDL2 by penetrating the first electrode portion E14 of the fourth transistor T4 and the first interlayer insulating layer 124.

The other connection hole CNH21 of the second connection holes CNH21 and CNH22 may be provided by the fifth opening OP5 of the second mask layer MSK2, and may reach the second electrode portion E21 of the first transistor T1 disposed in the first semiconductor layer SEL1 by penetrating the first electrode portion E13 of the third transistor T3, the first interlayer insulating layer 124, the second gate insulating layer 123, and the first gate insulating layer 122.

Figure 24:
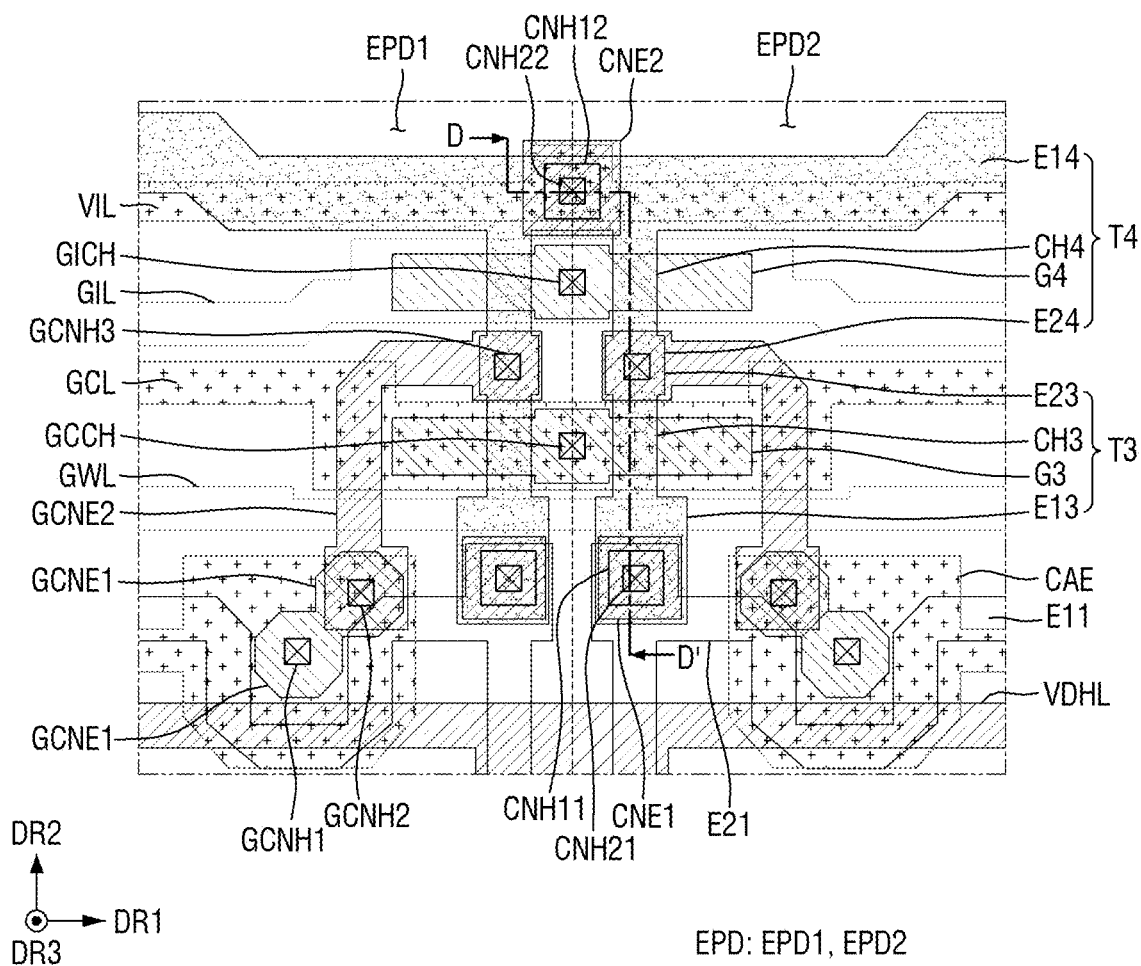
Figure 25:
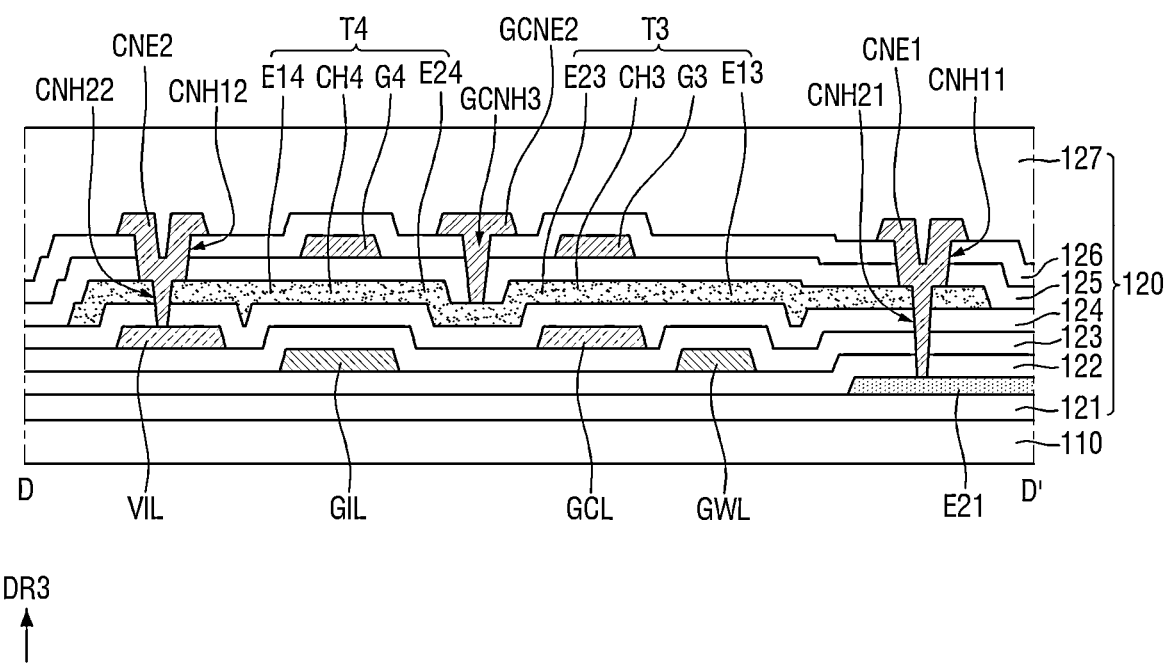

Referring to FIGS. 24 and 25, in the step S24 of disposing the first source-drain conductive layer SDCDL1, the first source-drain conductive layer SDCDL1 may be disposed by removing the second mask layer MSK2 and partially removing the conductive material layer stacked on the second interlayer insulating layer 126.

The first source-drain conductive layer SDCDL1 may include at least one connection electrode CNE1 and CNE2, the second gate connection electrode GCNE2, and the first power horizontal line VDHL.

The first connection electrode CNE1 of at least one connection electrode CNE1 and CNE2 may be electrically connected to the first electrode portion E13 of the third transistor T3 and the second electrode portion E21 of the first transistor T1 through the first connection hole CNH11 and the second connection hole CNH21, respectively. Accordingly, the first electrode portion E13 of the third transistor T3 may be electrically connected to the second electrode portion E21 of the first transistor T1 through the first connection electrode CNE1.

The second connection electrode CNE2 of at least one connection electrode CNE1 and CNE2 may be electrically connected to the first electrode portion E14 of the fourth transistor T4 and the first initialization voltage line VIL through the first connection hole CNH12 and the second connection hole CNH22, respectively. Accordingly, the first electrode portion E14 of the fourth transistor T4 may be electrically connected to the first initialization voltage line VIL through the second connection electrode CNE2.

The second gate connection electrode GCNE2 may be electrically connected to the first gate connection electrode GCNE1 through the second gate connection hole GCNH2, and may be electrically connected to the second electrode portion E23 of the third transistor T3 and the second electrode portion E24 of the fourth transistor T4 through the third gate connection hole GCNH3.

In the step S25 of disposing the first planarization layer 127, the first planarization layer 127 may be disposed by applying an organic insulating material that covers the first source-drain conductive layer SDCDL1 on the second interlayer insulating layer 126.

Figure 26:
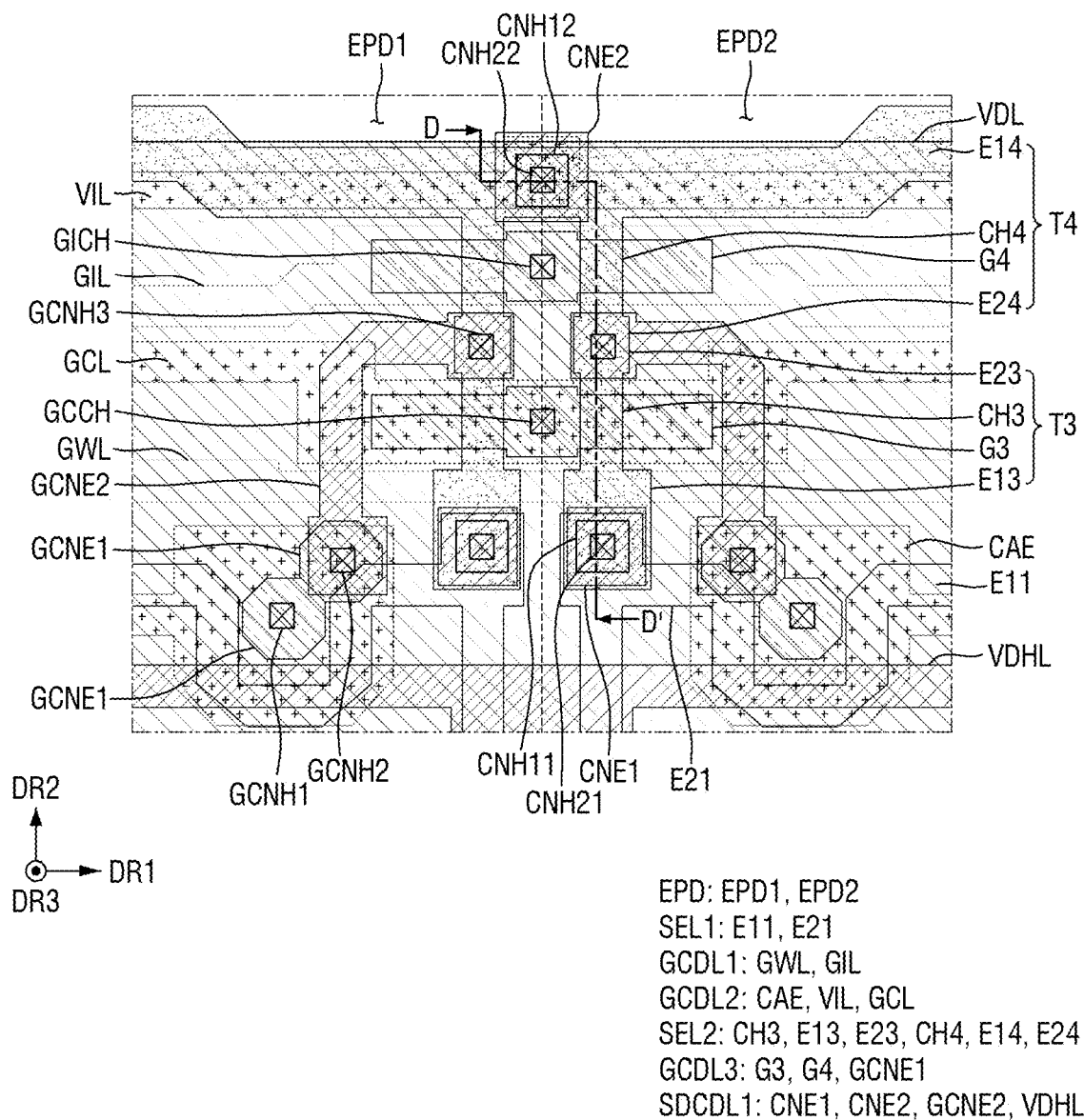
Figure 27:
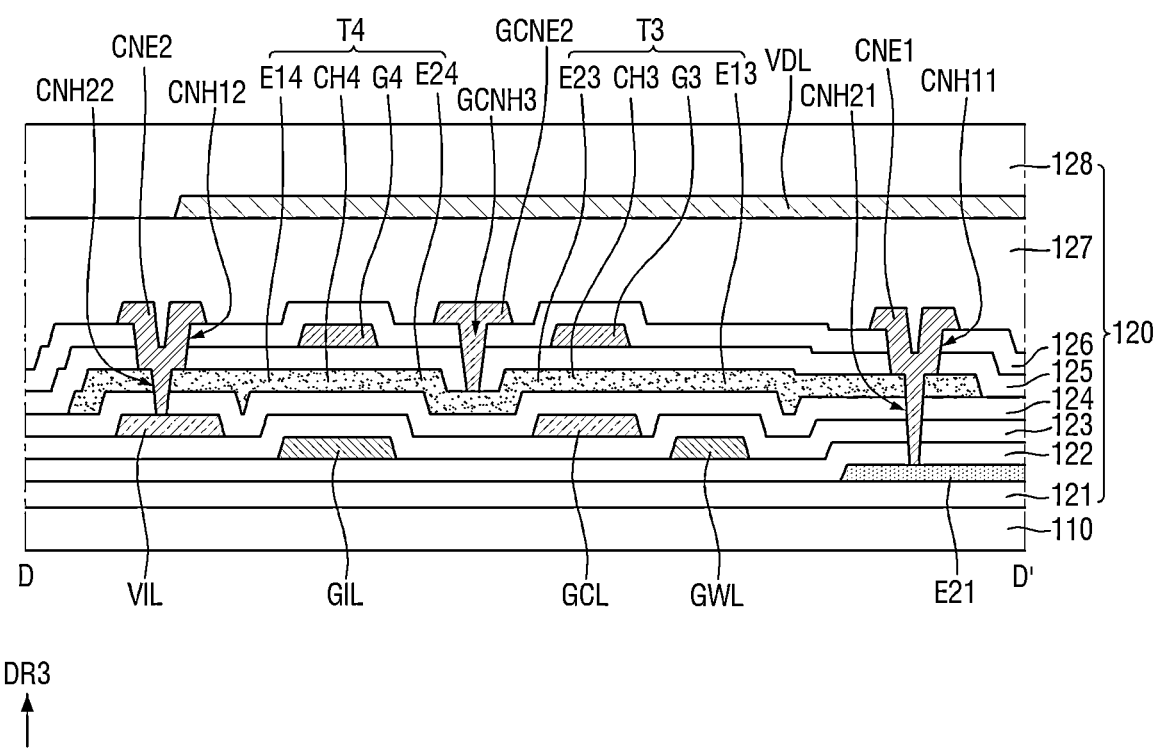

Referring to FIGS. 26 and 27, in the step S26 of disposing the second source-drain conductive layer DL and VDL (see FIG. 6) on the first planarization layer 127, the second source-drain conductive layer SDCDL2 may be disposed by partially removing a conductive material layer stacked on the first planarization layer 127.

The second source-drain conductive layer DL and VDL (see FIG. 6) may include the data line DL (see FIG. 6) and the first power line VDL (see FIG. 6).

In the step S27 of disposing the second planarization layer 128, the second planarization layer 128 may be disposed by applying an organic insulating material that covers the second source-drain conductive layer DL and VDL (see FIG. 6) on the first planarization layer 127.

However, the effects of the present disclosure are not restricted to the one set forth herein. The above and other effects of the present disclosure will become more apparent to one of daily skill in the art to which the present disclosure pertains by referencing the claims.

What is claimed is:
1. A display device comprising:
a substrate comprising a display area in which emission areas are arranged; and
a circuit layer disposed on the substrate,
wherein the circuit layer comprises:
a first semiconductor layer disposed on the substrate;
a first gate insulating layer covering the first semiconductor layer;
a first gate conductive layer disposed on the first gate insulating layer;
a second gate insulating layer covering the first gate conductive layer;
a second gate conductive layer disposed on the second gate insulating layer;
a first interlayer insulating layer covering the second gate conductive layer;

a second semiconductor layer disposed on the first interlayer insulating layer;

a third gate insulating layer covering the second semiconductor layer;

a third gate conductive layer disposed on the third gate insulating layer;

a second interlayer insulating layer covering the third gate conductive layer; and a first source-drain conductive layer disposed on the second interlayer insulating layer, wherein the first source-drain conductive layer comprises at least one connection electrode, each of the at least one connection electrode is electrically connected to the second semiconductor layer through a first connection hole, and is electrically connected to one of the first semiconductor layer, the first gate conductive layer, and the second gate conductive layer through a second connection hole, and the second connection hole overlaps at least a part of the second semiconductor layer and extends through the second semiconductor layer.

2. The display device of claim 1, wherein the second connection hole is spaced apart from the first connection hole.

3. The display device of claim 1, wherein the second connection hole overlaps a part of a center of the first connection hole.

4. The display device of claim 1, further comprising an element layer disposed on the circuit layer, and comprising light emitting elements respectively disposed in the emission areas, wherein the circuit layer comprises light emitting pixel drivers respectively electrically connected to the light emitting elements and arranged in parallel with each other, and each of the light emitting pixel drivers comprises:
a first transistor electrically connected between a first node and a second node;
a first pixel capacitor electrically connected between a first power line and a third node;
a second transistor electrically connected between a data line transmitting a data signal and the first node;
a third transistor electrically connected between the second node and the third node; and
a fourth transistor electrically connected between a first initialization voltage line transmitting a first initialization voltage and the third node, wherein the first node is electrically connected to a first electrode of the first transistor, the second node is electrically connected to a second electrode of the first transistor, and the third node is electrically connected to a gate electrode of the first transistor.

5. The display device of claim 4, wherein each of the first transistor, the second transistor, the third transistor and the fourth transistor comprises a channel portion, a first electrode portion connected to one side of the channel portion, a second electrode portion connected to an other side of the channel portion, and a gate electrode overlapping the channel portion, wherein, the channel portion, the first electrode portion, and the second electrode portion of the first transistor are disposed in the first semiconductor layer, the channel portion, the first electrode portion, and the second electrode portion of the second transistor are disposed in the first semiconductor layer, the gate electrode of the first transistor is disposed in the first gate conductive layer, the gate electrode of the second transistor is disposed in the first gate conductive layer, the channel portion, the first electrode portion, and the second electrode portion of the third transistor are disposed in the second semiconductor layer, the channel portion, the first electrode portion, and the second electrode portion of the fourth transistor are disposed in the second semiconductor layer, the gate electrode of the third transistor is disposed in the third gate conductive layer, and the gate electrode of the fourth transistor is disposed in the third gate conductive layer.

6. The display device of claim 5, wherein the at least one connection electrode comprises:
a first connection electrode electrically connecting the first electrode portion of the third transistor to the second electrode portion of the first transistor; and
a second connection electrode electrically connecting the first electrode portion of the fourth transistor to the first initialization voltage line.

7. The display device of claim 6, wherein the second connection hole of the first connection electrode extends through the second interlayer insulating layer, the third gate insulating layer, the second semiconductor layer, the first interlayer insulating layer, the second gate insulating layer, and the first gate insulating layer, and reaches the second electrode portion of the first transistor, and the first connection hole of the first connection electrode extends through the second interlayer insulating layer and the third gate insulating layer and is spaced apart from the second connection hole of the first connection electrode.

8. The display device of claim 6, wherein the second connection hole of the first connection electrode extends through the second interlayer insulating layer, the third gate insulating layer, the second semiconductor layer, the first interlayer insulating layer, the second gate insulating layer, and the first gate insulating layer, and reaches the second electrode portion of the first transistor, and the first connection hole of the first connection electrode extends through the second interlayer insulating layer and the third gate insulating layer and overlaps a part of the second connection hole of the first connection electrode.

9. The display device of claim 6, wherein the first initialization voltage line is disposed on the second gate conductive layer, the second connection hole of the second connection electrode extends through the second interlayer insulating layer, the third gate insulating layer, the second semiconductor layer, and the first interlayer insulating layer and reaches the first initialization voltage line, and the first connection hole of the second connection electrode extends through the second interlayer insulating layer and the third gate insulating layer and is spaced apart from the second connection hole of the second connection electrode.

10. The display device of claim 6, wherein the first initialization voltage line is disposed on the second gate conductive layer, the second connection hole of the second connection electrode extends through the second interlayer insulating layer, the third gate insulating layer, the second semiconductor layer, and the first interlayer insulating layer and reaches the first initialization voltage line, and the first connection hole of the second connection electrode extends through the second interlayer insulating layer and the third gate insulating layer and overlaps a part of the second connection hole of the second connection electrode.

11. The display device of claim 4, wherein each of the light emitting pixel drivers further comprises:

a fifth transistor electrically connected between the first power line and the first node;

a sixth transistor electrically connected between the second node and a fourth node; and a seventh transistor electrically connected between a second initialization voltage line transmitting a second initialization voltage and the fourth node, wherein, a channel portion, a first electrode portion, and a second electrode portion of the fifth transistor are disposed in the first semiconductor layer, a channel portion, a first electrode portion, and a second electrode portion of the sixth transistor are disposed in the first semiconductor layer, a channel portion, a first electrode portion, and a second electrode portion of the seventh transistor are disposed in the first semiconductor layer, a gate electrode of the fifth transistor, a gate electrode of the sixth transistor and a gate electrode of the seventh transistor are disposed in the first gate conductive layer.

12. The display device of claim 1, wherein the circuit layer further comprises:

a first planarization layer covering the first source-drain conductive layer;

a second source-drain conductive layer disposed on the first planarization layer; and a second planarization layer covering the second source-drain conductive layer.

13. A method for fabricating a display device, comprising:

preparing a substrate comprising a display area in which emission areas are arranged; and disposing a circuit layer comprising light emitting pixel drivers arranged side by side in a first direction and a second direction, on the substrate, wherein the disposing of the circuit layer comprises:

disposing a first semiconductor layer on the substrate;

disposing a first gate insulating layer covering the first semiconductor layer;

disposing a first gate conductive layer on the first gate insulating layer;

disposing a second gate insulating layer covering the first gate conductive layer;

disposing a second gate conductive layer on the second gate insulating layer;

disposing a first interlayer insulating layer covering the second gate conductive layer;

disposing a second semiconductor layer on the first interlayer insulating layer;

disposing a third gate insulating layer covering the second semiconductor layer;

disposing a third gate conductive layer on the third gate insulating layer;

disposing a second interlayer insulating layer covering the third gate conductive layer;

disposing a first connection hole reaching the second semiconductor layer;

disposing a second connection hole reaching one of the first semiconductor layer, the first gate conductive layer, and the second gate conductive layer; and disposing a first source-drain conductive layer on the second interlayer insulating layer, wherein in the disposing of the second connection hole, the second connection hole overlaps at least a part of the second semiconductor layer and extends through the second semiconductor layer.

14. The method of claim 13, wherein in the disposing of the second connection hole, the second connection hole is spaced apart from the first connection hole.

15. The method of claim 13, wherein in the disposing of the second connection hole, the second connection hole overlaps a part of a center of the first connection hole.

16. The method of claim 13, wherein in the disposing of the first source-drain conductive layer, the first source-drain conductive layer comprises at least one connection electrode, and each of the at least one connection electrode is electrically connected to the second semiconductor layer through the first connection hole, and is electrically connected to one of the first semiconductor layer, the first gate conductive layer, and the second gate conductive layer through the second connection hole.

17. The method of claim 13, further comprising, after disposing the circuit layer, disposing an element layer comprising light emitting elements respectively disposed in the emission areas, wherein the light emitting pixel drivers respectively are electrically connected to the light emitting elements, and each of the light emitting pixel drivers comprises:

a first transistor electrically connected between a first node and a second node;

a first pixel capacitor electrically connected between a first power line and a third node;

a second transistor electrically connected between a data line transmitting a data signal and the first node;

a third transistor electrically connected between the second node and the third node; and a fourth transistor electrically connected between a first initialization voltage line transmitting a first initialization voltage and the third node, wherein the first node is electrically connected to a first electrode of the first transistor, the second node is electrically connected to a second electrode of the first transistor, the third node is electrically connected to a gate electrode of the first transistor, wherein each of the first transistor, the second transistor, the third transistor and the fourth transistor comprises a channel portion, a first electrode portion connected to one side of the channel portion, a second electrode portion connected to an other side of the channel portion, and a gate electrode overlapping the channel portion, wherein, the channel portion, the first electrode portion, and the second electrode portion of the first transistor are disposed in the first semiconductor layer, the channel portion, the first electrode portion, and the second electrode portion of the second transistor are disposed in the first semiconductor layer, the gate electrode of the first transistor is disposed in the first gate conductive layer, the gate electrode of the second transistor is disposed in the first gate conductive layer, the channel portion, the first electrode portion, and the second electrode portion of the third transistor are disposed in the second semiconductor layer, the channel portion, the first electrode portion, and the second electrode portion of the fourth transistor are disposed in the second semiconductor layer, the gate electrode of the third transistor is disposed in the third gate conductive layer, and the gate electrode of the fourth transistor is disposed in the third gate conductive layer.

18. The method of claim 17, wherein the at least one connection electrode comprises:

a first connection electrode electrically connecting the first electrode portion of the third transistor to the second electrode portion of the first transistor; and a second connection electrode electrically connecting the first electrode portion of the fourth transistor to the first initialization voltage line.

19. The method of claim 18, wherein the second connection hole of the first connection electrode extends through the second interlayer insulating layer, the third gate insulating layer, the second semiconductor layer, the first interlayer insulating layer, the second gate insulating layer, and the first gate insulating layer, and reaches the second electrode portion of the first transistor, and the first connection hole of the first connection electrode extends through the second interlayer insulating layer and the third gate insulating layer and overlaps a part of the second connection hole of the first connection electrode.

20. The method of claim 18, wherein in the disposing of the second gate conductive layer, the second gate conductive layer comprises the first initialization voltage line, the second connection hole of the second connection electrode extends through the second interlayer insulating layer, the third gate insulating layer, the second semiconductor layer, and the first interlayer insulating layer and reaches the first initialization voltage line, and the first connection hole of the second connection electrode extends through the second interlayer insulating layer and the third gate insulating layer and overlaps a part of the second connection hole of the second connection electrode.

\* \* \* \* \*